(12) United States Patent
Shinojima

(10) Patent No.: US 12,028,968 B2
(45) Date of Patent: Jul. 2, 2024

(54) SUBSTRATE AND ELECTRONIC DEVICE

(71) Applicant: Sony Group Corporation, Tokyo (JP)

(72) Inventor: Takahiro Shinojima, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 420 days.

(21) Appl. No.: 17/312,001

(22) PCT Filed: Dec. 19, 2018

(86) PCT No.: PCT/JP2018/046726
§ 371 (c)(1),
(2) Date: Jun. 9, 2021

(87) PCT Pub. No.: WO2020/129171
PCT Pub. Date: Jun. 25, 2020

(65) Prior Publication Data
US 2022/0015221 A1    Jan. 13, 2022

(51) Int. Cl.
*H03H 7/38* (2006.01)
*H01P 1/04* (2006.01)
(Continued)

(52) U.S. Cl.
CPC ............ *H05K 1/025* (2013.01); *H01P 1/04* (2013.01); *H03H 7/38* (2013.01); *H05K 1/024* (2013.01);
(Continued)

(58) Field of Classification Search
CPC . H03H 7/38; H05K 1/11; H05K 1/025; H05K 1/0251; H05K 1/024; H05K 3/46;
(Continued)

(56) References Cited

U.S. PATENT DOCUMENTS

| 6,133,805 A | 10/2000 | Jain et al. |
| 7,030,712 B2 * | 4/2006 | Brunette ............. H05K 1/0222 333/260 |

(Continued)

FOREIGN PATENT DOCUMENTS

| CN | 1770954 A | 5/2006 |
| CN | 1799290 A | 7/2006 |

(Continued)

OTHER PUBLICATIONS

Extended European Search Report dated Feb. 17, 2022, in corresponding European Patent Application 18943993.8.

(Continued)

*Primary Examiner* — Stephen E. Jones
(74) *Attorney, Agent, or Firm* — XSENSUS LLP

(57) ABSTRACT

Provided is an example of a technology capable of accurately controlling impedance.

Provided is a substrate including a first through hole that penetrates a substrate from a first face to a second face of the substrate, and is electrically connected to a transmission line through which a signal is transmitted, a second through hole that is provided adjacent to the first through hole in plan view of the substrate, penetrates the substrate from the first face to the second face, and is electrically connected to a ground, and an adjustment unit that adjusts a distance between the first through hole and the second through hole in plan view of the substrate to adjust an impedance of a connection end of the first through hole with the transmission line.

20 Claims, 20 Drawing Sheets

(51) Int. Cl.
*H05K 1/02* (2006.01)
*H05K 1/11* (2006.01)

(52) U.S. Cl.
CPC .............. *H05K 1/0251* (2013.01); *H05K 1/11* (2013.01); *H05K 2201/0187* (2013.01); *H05K 2201/09063* (2013.01); *H05K 2201/095* (2013.01)

(58) Field of Classification Search
CPC .... H05K 2201/09063; H05K 2201/095; H01P 5/08; H01P 1/04
See application file for complete search history.

(56) References Cited

U.S. PATENT DOCUMENTS

| | | |
|---|---|---|
| 2004/0118605 A1 | 6/2004 | Van Der Laan |
| 2010/0044096 A1 | 2/2010 | Kuczynski |
| 2014/0001150 A1 | 1/2014 | Lecesse |
| 2014/0102778 A1 | 4/2014 | Shiozaki |
| 2014/0262455 A1 | 9/2014 | Iketani et al. |
| 2017/0215274 A1 | 7/2017 | Yan et al. |

FOREIGN PATENT DOCUMENTS

| | | |
|---|---|---|
| CN | 102946695 A | 2/2013 |
| CN | 203120286 U | 8/2013 |
| CN | 104378912 A | 2/2015 |
| JP | H11251801 A | 9/1999 |
| JP | 2007-250885 A | 9/2007 |
| JP | 2008-205099 A | 9/2008 |
| JP | 2012-129350 A | 7/2012 |
| JP | 2015185735 A | 10/2015 |
| JP | 2016517173 A | 6/2016 |
| WO | 2004/107830 A1 | 12/2004 |

OTHER PUBLICATIONS

International Search Report and Written Opinion dated Mar. 19, 2019, received for PCT Application PCT/JP2018/046726, Filed on Dec. 19, 2018, 9 pages including English Translation.

* cited by examiner

SUBSTRATE AND ELECTRONIC DEVICE

CROSS-REFERENCE TO RELATED APPLICATION

The present application is based on PCT filing PCT/JP2018/046726, filed Dec. 19, 2018, the entire contents of which are incorporated herein by reference.

FIELD

The present disclosure relates to a substrate and an electronic device.

BACKGROUND

It is required to design a wiring substrate, including a transmission line for transmitting a signal, which is provided in a radio terminal (for example, a smartphone) used in a radio communication system so as to avoid impedance mismatch in order to avoid signal loss. In other words, in the wiring substrate, it is required to accurately control the impedance so that the transmission line or the like that transmits a signal has a desired impedance in a desired frequency band. Furthermore, in recent years, the frequency of radio signals used in radio communication systems has been increasing, and the signal propagation loss and reflection loss increase as the frequency goes up, so that there is a strong demand for accurate control of impedance.

SUMMARY

Technical Problem

Therefore, in the present disclosure, an example of a substrate capable of accurately controlling impedance is proposed.

Solution to Problem

According to the present disclosure, a substrate is provided that includes: a first through hole that penetrates the substrate from a first face to a second face of the substrate, and is electrically connected to a transmission line through which a signal is transmitted; a second through hole that is provided adjacent to the first through hole in plan view of the substrate, penetrates the substrate from the first face to the second face, and is electrically connected to a ground; and an adjustment unit that adjusts a distance between the first through hole and the second through hole in plan view of the substrate to adjust an impedance of a connection end of the first through hole with the transmission line.

Moreover, according to the present disclosure, a substrate is provided that includes: a first through hole that penetrates the substrate from a first face to a second face of the substrate, and is electrically connected to a transmission line through which a signal is transmitted; a second through hole that is provided adjacent to the first through hole in plan view of the substrate, penetrates the substrate from the first face to the second face, and is electrically connected to a ground; and an adjustment unit that adjusts an impedance of a connection end of the first through hole with the transmission line, wherein the second through hole has a first portion that penetrates the substrate from the first face to a middle of a thickness of the substrate, a second portion that penetrates the substrate from the second face to a middle of a thickness of the substrate, and a dividing portion that electrically divides the first portion and the second portion, and the adjustment unit adjusts a length of the dividing portion along a thickness direction of the substrate to adjust the impedance.

Furthermore, according to the present disclosure, an electronic device including a substrate is provided, wherein the substrate includes a first through hole that penetrates a substrate from a first face to a second face of the substrate, and is electrically connected to a transmission line through which a signal is transmitted, a second through hole that is provided adjacent to the first through hole in plan view of the substrate, penetrates the substrate from the first face to the second face, and is electrically connected to a ground, and an adjustment unit that adjusts a distance between the first through hole and the second through hole in plan view of the substrate to adjust an impedance of a connection end of the first through hole with the transmission line.

Advantageous Effects of Invention

As described above, according to the present disclosure, it is possible to provide a substrate capable of accurately controlling impedance.

Note that the above-described effect is not necessarily restrictive, and any one of effects described in the present specification or any another effect obtainable from the present specification may be exhibited in addition to or in place of the above-described effect.

DESCRIPTION OF EMBODIMENTS

Figure 1:
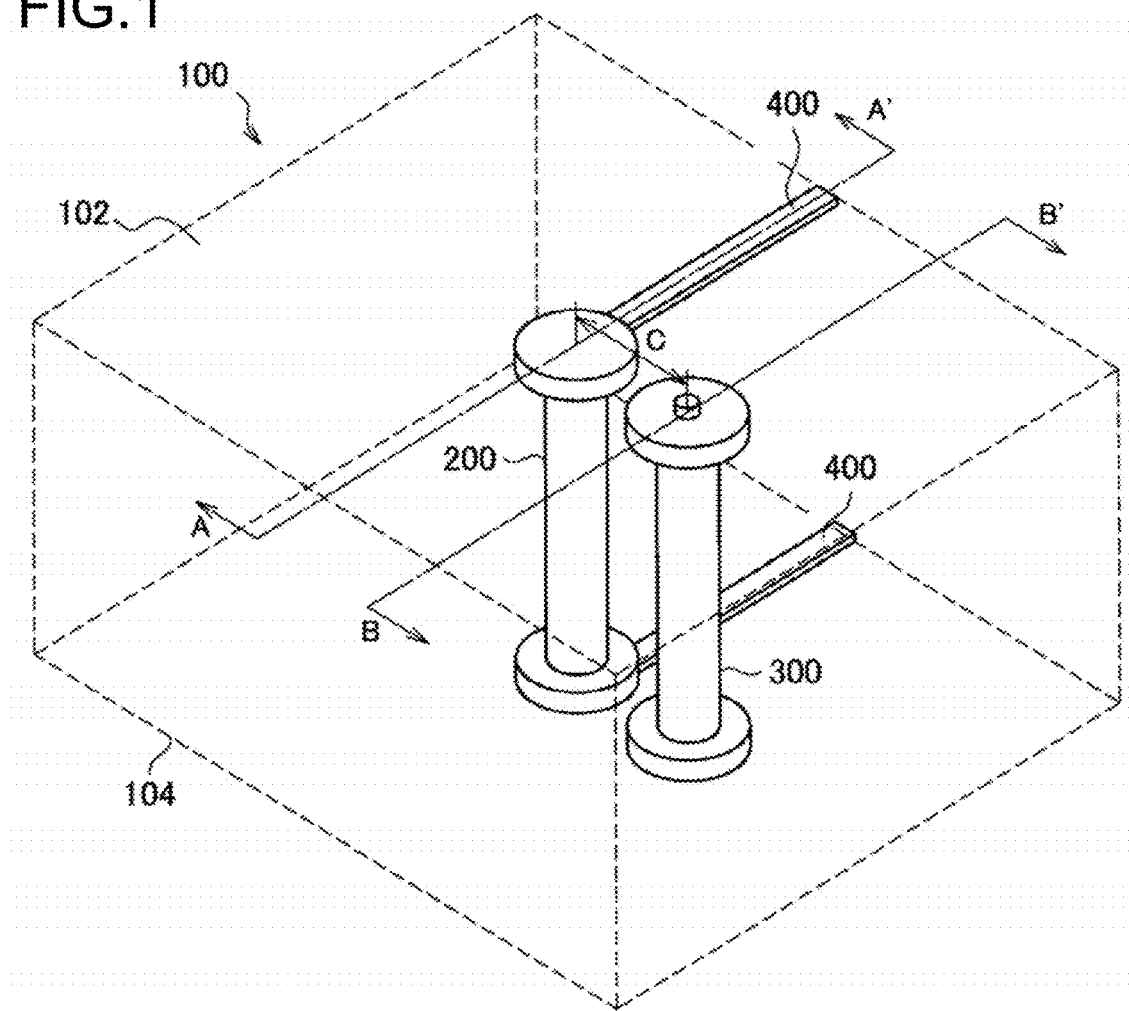
FIG. 1 is a perspective view of a substrate 100 according to a first embodiment of the present disclosure.

Hereinafter, preferred embodiments of the present disclosure will be described in detail with reference to the accompanying drawings. Note that, in the present specification and drawings, redundant description of a component having substantially the same functional configuration is omitted by providing the same reference numeral.

Further, in the present specification and drawings, a plurality of components having substantially the same or similar functional configurations may be distinguished by adding different numbers after the same reference numerals. However, when it is not necessary to distinguish each of the plurality of components having substantially the same or similar functional configurations, only the same reference numerals are given. In addition, similar components of different embodiments may be distinguished by adding different alphabets after the same reference numerals. However, when there is no particular need to distinguish between similar components, only the same reference numerals are given.

In addition, the drawings referred to in the following description are drawings for explaining the embodiments of the present disclosure and promoting their understanding, and for the sake of clarity, the shapes, dimensions, ratios, etc. illustrated in the drawings may be different from actual ones. Further, the substrates illustrated in the drawings, each component included in the substrates, and the like can be appropriately redesigned in consideration of the following description and known techniques.

In addition, the description of the specific length (numerical value) and shape in the following explanation does not mean only the same value as the mathematically defined numerical value or the geometrically defined shape, and in the manufacturing process and use of substrates and electronic devices, it shall also include cases where there is an acceptable degree of difference or a shape similar to that shape. For example, when the term "circular shape" is used in the following description, it is not limited to a perfect circle, and also includes a shape similar to a perfect circle such as an ellipse.

Further, in the following description of the circuit (electrical connection), unless otherwise specified, "electrically connected" means that connection is implemented so that electricity (signal) is conducted (transmitted) between a plurality of elements. In addition, "electrically connected" in the following description includes not only when connecting electrically a plurality of elements directly but also when connecting electrically a plurality of elements through other elements.

The description will be given in the following order.
1. Background of the present inventors' creation of the embodiments of the present disclosure
2. First embodiment
2.1 Configuration
2.2 Example
3. Second embodiment
3.1 Configuration
3.2 Example
4. Third embodiment
4.1 Configuration
4.2 Example
5. Fourth embodiment
5.1 Configuration
5.2 Example
6. Summary
7. Application example
8. Supplement 1. Background of the Present Inventors' Creation of the Embodiments of the Present Disclosure First, before describing the details of the embodiments of the present disclosure, the background from which the present inventors created the embodiments of the present disclosure will be described.

As explained earlier, in the design of the wiring substrate provided in the radio terminal used in the radio communication system, accurate control is required so that the transmission line and the through holes and the like connected to the transmission line have the desired impedance in the desired frequency band in order to avoid signal loss. In particular, in recent years, the frequency of radio signals used in radio communication systems has been increasing, and the signal propagation loss and reflection loss increase as the frequency goes up, so that there is a strong demand for accurate control of impedance.

Until now, it has been common to control the impedance of a transmission line or the like by devising a pattern of the transmission line or the like, for example, by providing a stub on a wiring substrate. However, as the frequency of the radio signal increases, it is difficult to replace the pattern of the transmission line or the like as described above with a simple equivalent circuit including an inductance, a capacitor, a resistive element, or the like. Therefore, there is a limit in designing a pattern of a transmission line or the like using such an equivalent circuit and controlling impedance more accurately. Further, as radio terminals have become smaller and more multifunctional, wiring substrates have become smaller and are equipped with many functional units. From such a situation, since the degree of freedom in designing a pattern of wiring or the like on a wiring substrate is becoming limited, there is a limit to control impedance more accurately by the pattern of the transmission line or the like.

Furthermore, under such circumstances, the fifth generation (5G) mobile unit communication system following Long Term Evolution (LTE)/LTE-Advanced is being studied. In such studies, it has been proposed to use high frequency radio signals called millimeter waves such as 28 GHz and 39 GHz (in the following description, simply referred to as "millimeter waves"). For example, compared to radio signals with frequencies of 700 MHz to 3.5 GHz, which have been generally used in mobile unit communication systems, millimeter waves can increase the amount of information transmitted, but on the other hand tend to increase propagation loss and reflection loss. Therefore, in the future, it is expected that with the use of millimeter waves, it will be more strongly required to control the impedance accurately in order to further suppress the increase in signal propagation loss and reflection loss.

Therefore, in view of such a situation, the present inventors have tried to realize accurate control of impedance even when the frequency of the radio signal used is high, and the present inventors have created a substrate according to the embodiment of the present disclosure described below. According to the embodiment of the present disclosure, it is possible to provide a substrate capable of accurately controlling impedance even when the frequency of the radio signal used is high. Further, according to the embodiment of the present disclosure, the impedance can be accurately controlled even when the degree of freedom in designing the pattern on the substrate (on the substrate face) is restricted. Hereinafter, details of embodiments of the present disclosure will be sequentially described.

2. First Embodiment

2.1 Configuration

Figure 2:
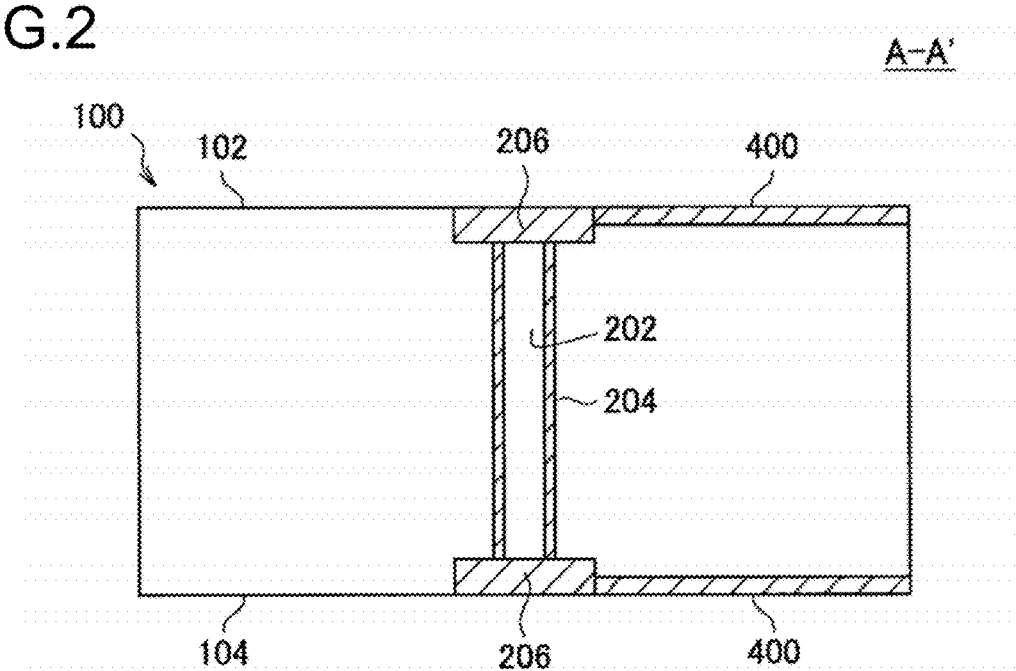
FIG. 2 is a cross-sectional view of a signal through hole 200 according to the first embodiment of the present disclosure.
Figure 3:
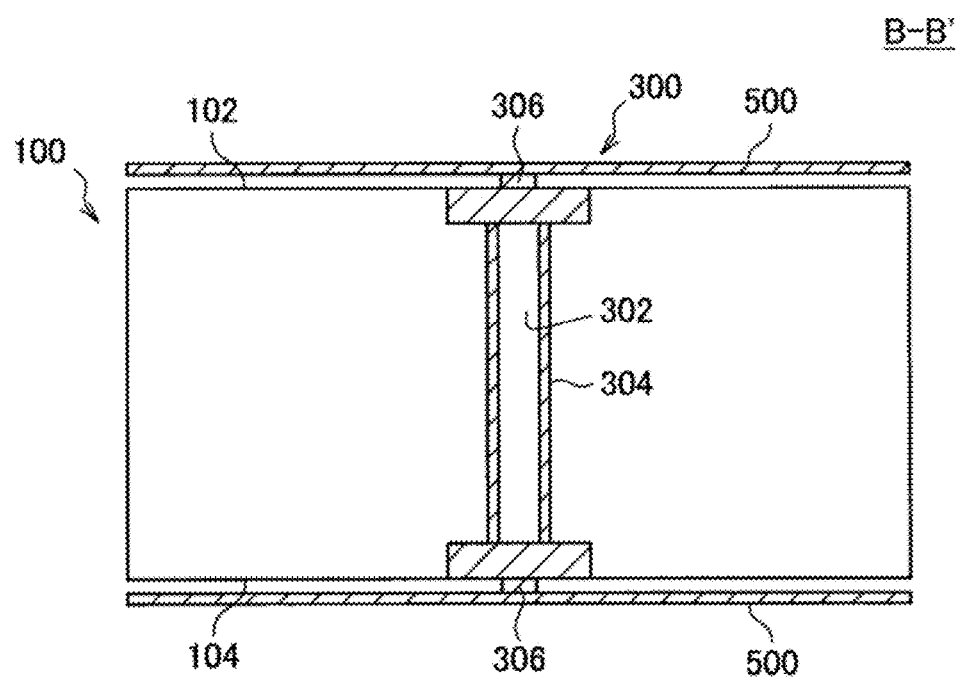
FIG. 3 is a cross-sectional view of a ground through hole 300 according to the first embodiment of the present disclosure.

First, the configuration of a substrate 100 according to a first embodiment of the present disclosure will be described with reference to FIGS. 1 to 3. FIG. 1 is a perspective view of the substrate 100 according to the present embodiment. In FIG. 1, in order to clearly illustrate the signal through hole (first through hole) 200 and the ground through hole (second through hole) 300 included in the substrate 100, they are illustrated so that the substrate 100 is transparent by illustrating the outline of the substrate 100 with a broken line. Further, in FIG. 1, for convenience, the only one signal through hole 200 and its peripheral region (a region of 5 mm×5 mm square with the signal through hole 200 as the center) are illustrated. Therefore, the substrate 100 according to the present embodiment may include a plurality of signal through holes 200, in other words, the form as illustrated in FIG. 1 may be plurally combined. Further, FIG. 2 is a cross-sectional view of the signal through hole 200 according to the present embodiment, and, for more information, it is a cross-sectional view of the signal through hole 200 when cut along the thickness direction of the substrate 100 (that is, when the substrate 100 is cut along the line A-A' in FIG. 1). Further, FIG. 3 is a cross-sectional view of the ground through hole 300 according to the present embodiment, and, for more information, it is a cross-sectional view of the ground through hole 300 when cut along the thickness direction of the substrate 100 (that is, when the substrate 100 is cut along the line B-B' of FIG. 1).

As illustrated in FIG. 1, in the present embodiment, the substrate 100 has the signal through hole 200 that penetrates the substrate 100 from an upper face (first face) 102 to a lower face (second face) 104, and is electrically connected to a transmission line 400 through which a signal is transmitted. Further, in the present embodiment, the substrate 100 has the ground through hole 300 that is provided adjacent to the signal through hole 200 in plan view of the substrate 100 (when the upper face 102 is viewed from above the substrate 100), penetrates the substrate 100 from the upper face 102 to the lower face 104, and is electrically connected to the ground (not illustrated). The detailed configurations of the substrate 100, the signal through hole 200, the ground through hole 300, and the like in the present embodiment will be sequentially described below.

(Substrate 100)

The substrate 100 is a substrate made of a dielectric layer having a relative permittivity ε=3.0 to 5.0 and a dielectric loss tangent (dissipation factor; DF) tan δ=around 0.01, such as, for example, a cured Flame Retardant Type 4 (FR4) substrate made by glass fiber with impregnated epoxy resin, or a liquid crystal polymer (LCP) substrate. Further, in the present embodiment, the substrate 100 may be a laminated body formed by laminating a plurality of dielectric layers as described above. Further, the substrate 100 may be an inflexible rigid substrate or a flexible substrate that can be bent freely.

The thickness of the substrate 100 is not particularly limited, but can be, for example, about several mm (for example, about 1.3 mm). By attaching a metal film such as a copper foil to the upper face 102 and the lower face 104 of the substrate 100, the electrodes and the wiring patterns as described later can be formed. Further, in the present embodiment, another substrate (not illustrated) that sandwiches the substrate 100 from the vertical direction in FIG. 1 may be provided, and such a substrate may be a conductor layer 500 (see FIG. 3) made of a metal film electrically connected to the ground (grounding).

(Signal through Hole 200)

As illustrated in FIG. 2, the signal through hole 200 has a through hole 202 that extends along a direction perpendicular to the upper face 102 of the substrate 100 and penetrates the substrate 100 from the upper face 102 to the lower face 104. Further, the signal through hole 200 includes a metal film 204 that covers the inner wall of the through hole 202 described above, and a signal contact (electrode) 206 provided at the end of the through hole 202.

In FIGS. 1 and 2, the cross section of the through hole 202 when cut along a plane parallel to the upper face 102 is illustrated as, for example, a cylindrical section having an outer diameter of 0.2 mm. However, in the present embodiment, the cross section is not limited to a cylindrical shape, and may have a polygonal tubular shape (for example, a triangular or quadrangular tube).

Further, the metal film 204 is, for example, a metal film such as copper having a thickness of several tens of μm, and forms a tubular conductor by covering the inner wall of the through hole 202.

Further, the signal contact (transmission line contact) 206 provided at the end of the through hole 202 is an electrode made of a metal foil of, for example, a copper foil having a thickness of several tens of μm provided on each of the upper face 102 and the lower face 104 of the substrate 100. By connecting the signal contact 206 to the transmission line 400 provided on the upper face 102 and the lower face 104, the signal through hole 200 is electrically connected to the transmission line 400. In FIGS. 1 and 2, the signal contact 206 is illustrated as a disk having a radius of, for example, about 0.2 mm. However, in the present embodiment, the signal contact 206 is not limited to a disk shape, and may be, for example, a polygonal plate shape (for example, a triangle or a quadrangle).

Further, the transmission line 400 is a wiring through which a high frequency signal is transmitted, and is made of a metal foil (for example, a thickness of several tens of μm) of a copper foil or the like provided on both the upper face 102 and the lower face 104 of the substrate 100 or on one of them. Further, the width, shape, and routing of the transmission line 400 are not particularly limited in the present embodiment, and can be selected according to the characteristics required for the transmission line 400 and the like. In addition, in the present embodiment, it is not limited to being provided on both or one of the upper face 102 and the lower face 104 of the substrate 100. In the present embodiment, for example, when the substrate 100 is laminated with two or more different dielectric layers (not illustrated), the transmission line 400 may be provided on an intermediate face (not illustrated) sandwiched between the dielectric layers.

The signal through hole 200 can be formed by forming the through hole 202 in the substrate 100 using, for example, a drill or the like, and depositing the metal film 204 on the inner wall of the through hole 202 by plating. By making the cross section of the through hole 202 cylindrical, the through hole 202 can be easily formed.

(Ground through Hole 300)

The ground through hole 300 is provided so as to be adjacent to the signal through hole 200 in plan view of the substrate 100. Further, as illustrated in FIG. 3, the ground through hole 300 has a through hole 302 that extends along a direction perpendicular to the upper face 102 of the substrate 100, and penetrates the substrate 100 from the upper face 102 to the lower face 104. Further, the ground through hole 300 includes a metal film 304 covering the inner wall of the through hole 302 described above, and a ground contact (electrode) 306 provided at the end of the through hole 302.

In FIGS. 1 and 3, the cross section of the through hole 302 when cut along a plane parallel to the upper face 102 is illustrated as, for example, a cylindrical section having an outer diameter of 0.2 mm, as in the signal through hole 200. However, in the present embodiment, as in the signal through hole 200, the cross section is not limited to a cylindrical shape, and may have a polygonal tubular shape (for example, a triangular or quadrangular tube).

Further, as in the signal through hole 200, the metal film 304 is, for example, a metal film such as copper having a thickness of several tens of μm, and forms a tubular conductor by covering the inner wall of the through hole 302.

Further, the ground contact 306 provided at the end of the through hole 302 is an electrode provided on each of the upper face 102 and the lower face 104 of the substrate 100 and made of a metal film having a thickness of, for example, several tens of μm. The ground contact 306 is connected to the conductor layer 500, made of a metal film connected to the ground (grounding), that sandwiches the substrate 100 from the vertical direction in FIG. 3, so that the ground through hole 300 is electrically connected to the ground. In FIGS. 1 and 3, the ground contact 306 is illustrated as a disk having a radius of, for example, about 0.2 mm, as in the signal through hole 200. However, in the present embodiment, the ground contact 306 is not limited to a disk shape, and may be, for example, a polygonal plate shape (for example, a triangle or a quadrangle). Further, in the present embodiment, the conductor layer 500 connected to the ground is not limited to being provided so as to sandwich the substrate 100 from the vertical direction. In the present embodiment, for example, when the substrate 100 is laminated with two or more different dielectric layers (not illustrated), the conductor layer 500 may be provided so as to be sandwiched between the dielectric layers.

Further, the ground through hole 300 can be formed in the same manner as the signal through hole 200. Further, the substrate 100 including the signal through hole 200 and the ground through hole 300 may be formed by a 3D printer or the like.

In the substrate 100 according to the present embodiment, by adjusting the distance between the signal through hole 200 and the ground through hole 300 in plan view of the substrate 100, the impedance of the connection end of the signal through hole 200 with the transmission line 400 can be adjusted. That is, it can be said that the substrate 100 according to the present embodiment has an adjustment unit that adjusts the distance between the signal through hole 200 and the ground through hole 300 to adjust the impedance. In the present embodiment, by having such an adjustment unit, impedance of the connection end of the signal through hole 200 can be adjusted to the desired impedance (for example, 50Ω) at a specific frequency. As a result, in the present embodiment, since impedance mismatch between the signal through hole 200 and the transmission line 400 can be avoided, it is possible to further suppress an increase in signal propagation loss and reflection loss.

For more information, in the present embodiment, by adjusting a distance C illustrated in FIG. 1 (in plan view of the substrate 100, the distance from the central axis of the signal through hole 200 to the central axis of the ground through hole 300), the impedance of the connection end of the signal through hole 200 is adjusted. By providing the ground through hole 300 so as to be adjacent to the signal through hole 200, a capacitance component and an inductor component will be generated parasitically between the signal through hole 200 and the ground through hole 300. Then, the size and distribution of the capacitance component and the inductor component generated between the signal through hole 200 and the ground through hole 300 can be changed by adjusting the distance C. Therefore, in the present embodiment, the above-mentioned capacitance component and inductor component are adjusted by changing the distance C, and the impedance of the connection end of the signal through hole 200 at a desired frequency can be set to the target impedance (for example, 50Ω). As a result, according to the present embodiment, since impedance mismatch between the signal through hole 200 and the transmission line 400 can be avoided, it is possible to further suppress an increase in signal propagation loss and reflection loss. In the present embodiment, the distance C is not particularly limited, but can be set to, for example, about 0.5 mm to 1.7 mm.

2.2 Example

Figure 4:
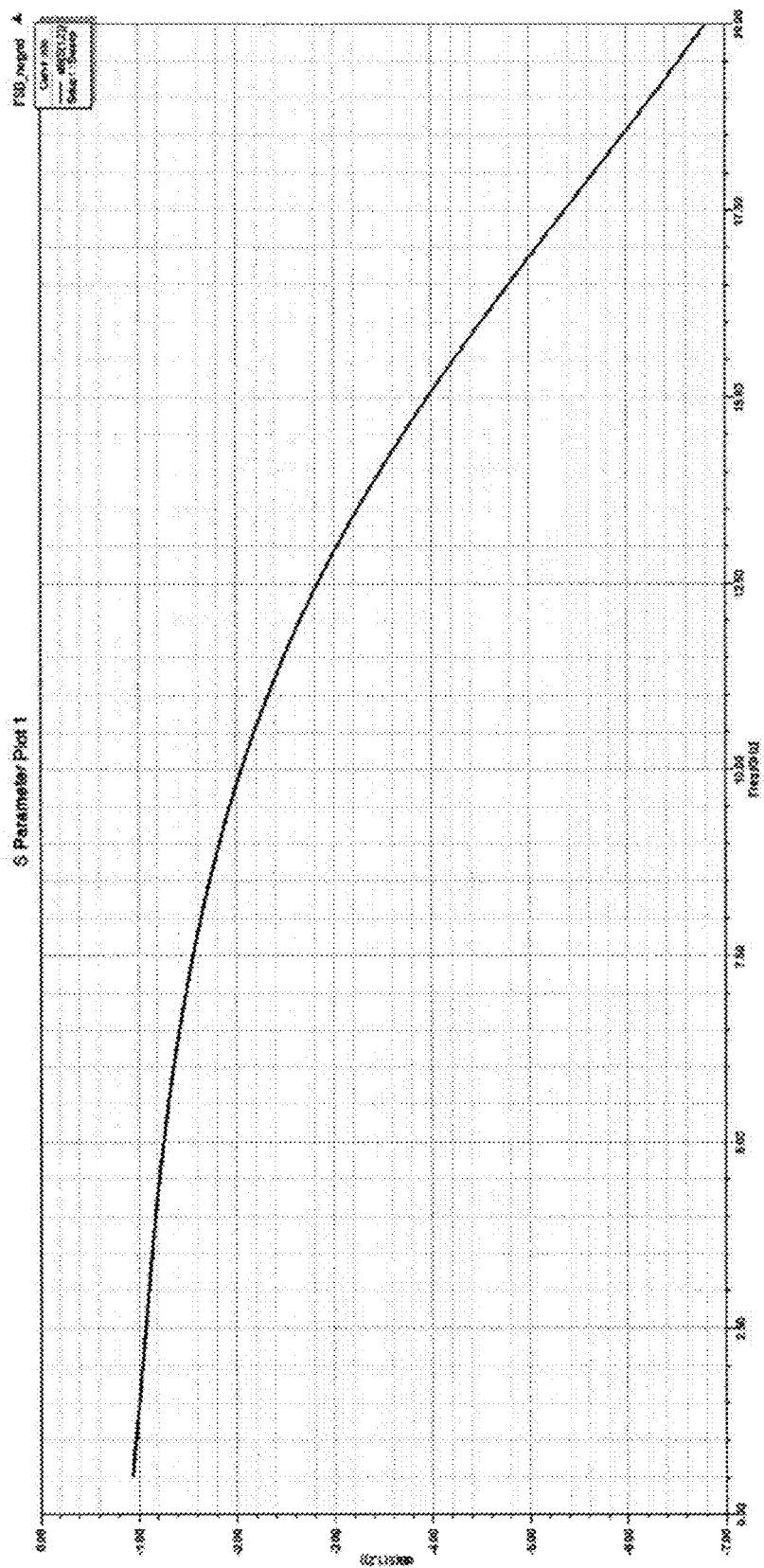
FIG. 4 is a graph of a pass characteristic (S12) of a signal through hole in a substrate according to a comparative example.
Figure 5:
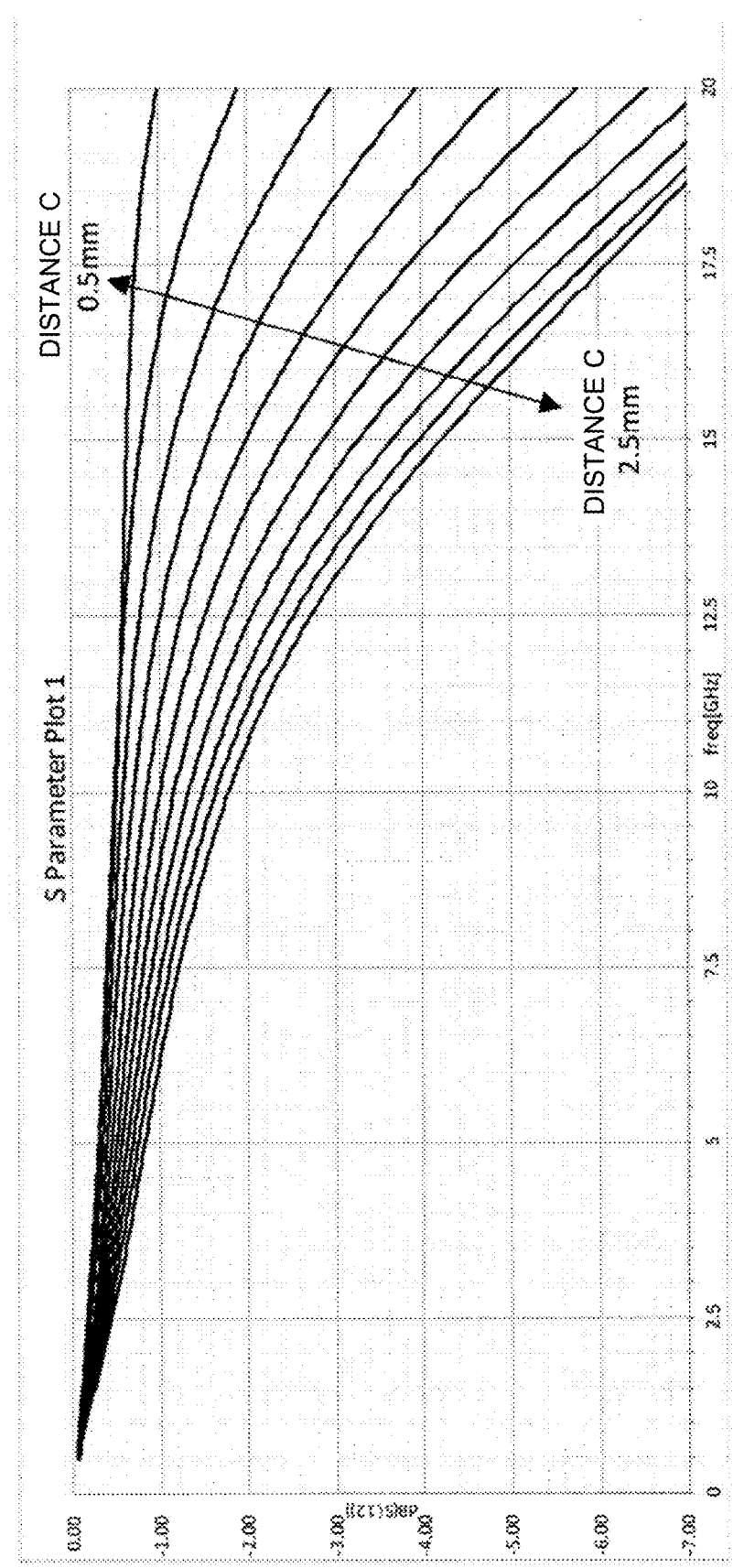
FIG. 5 is a graph of pass characteristics (S12) of the signal through hole 200 in the substrate 100 according to the example.
Figure 6:
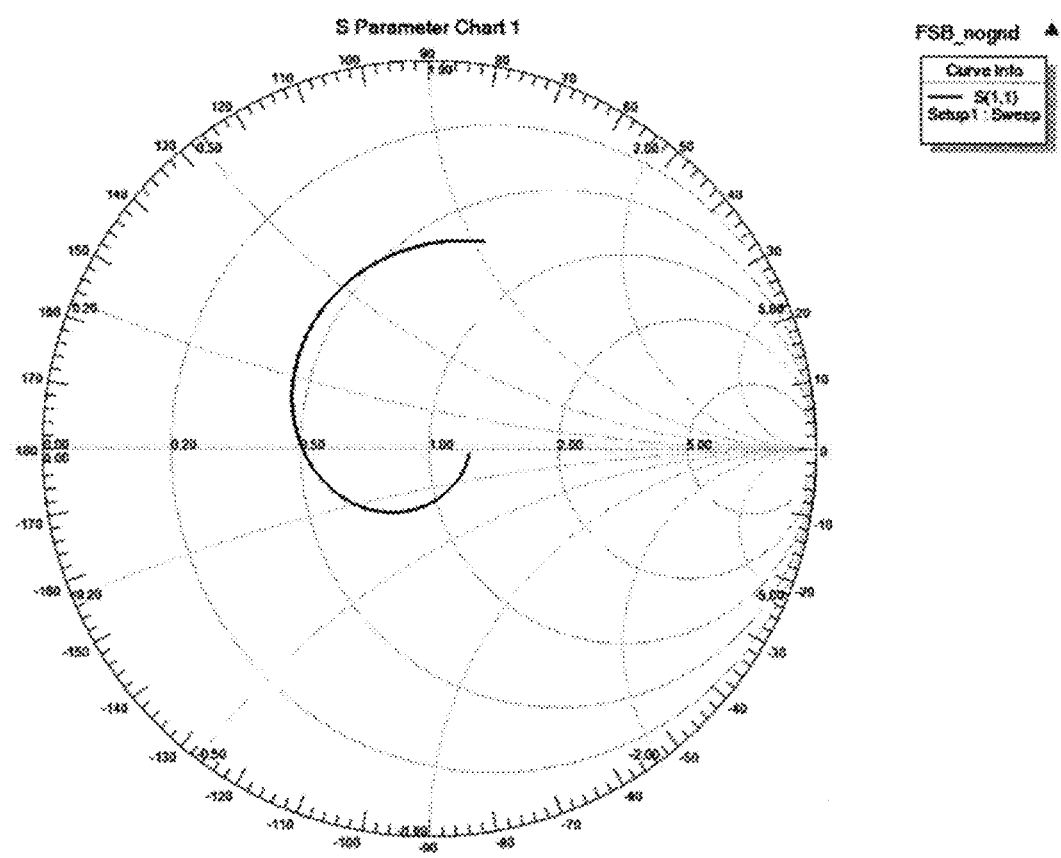
FIG. 6 is a Smith chart (S11) illustrating the impedance of the connection end of the signal through hole in the substrate according to the comparative example.
Figure 7:
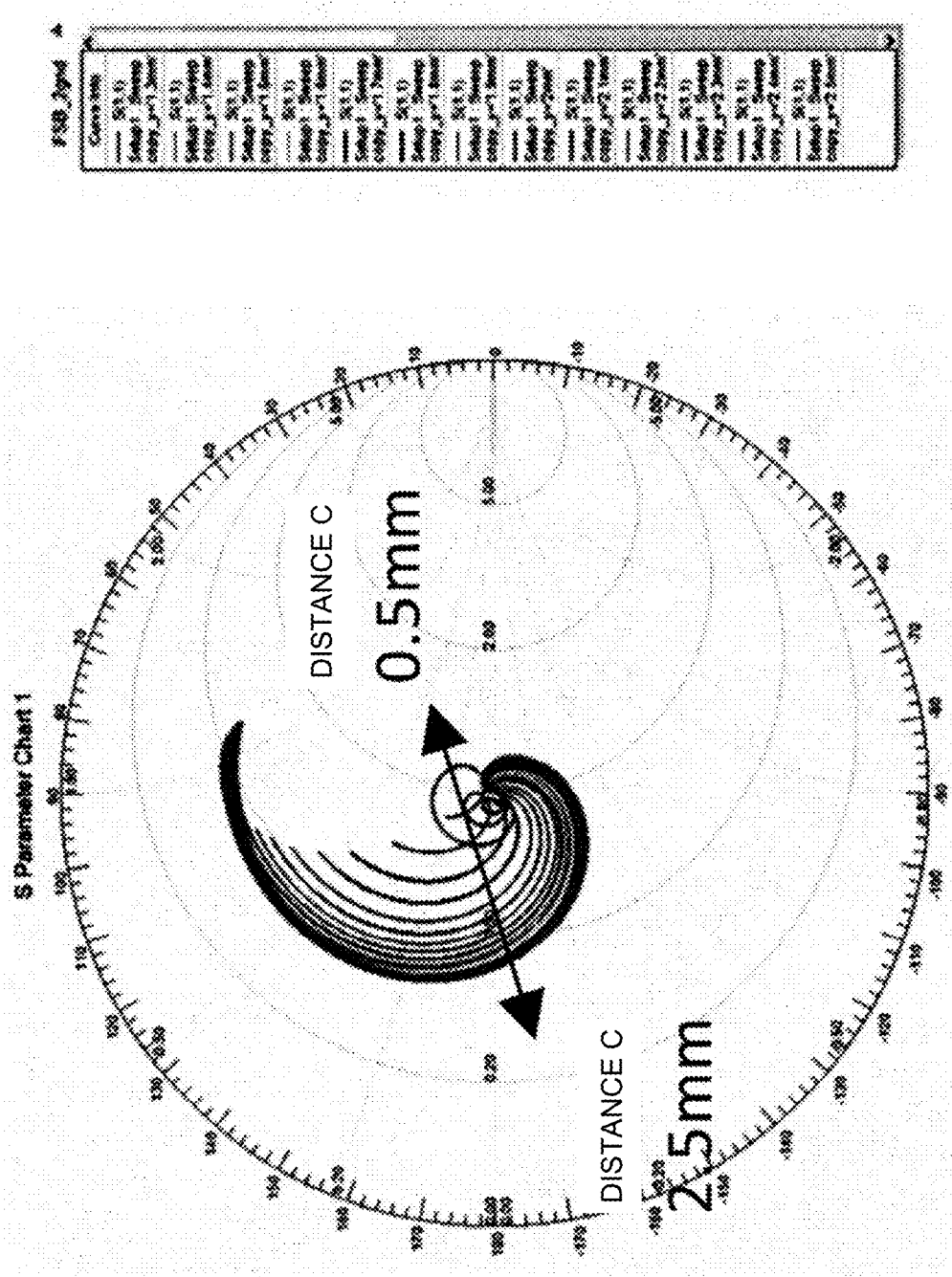
FIG. 7 is a Smith chart (S11) illustrating the impedance of the connection end of the signal through hole 200 in the substrate 100 according to the example.

The details of the configuration of the substrate 100 according to the first embodiment have been described above. Next, the example of the present embodiment will be described more specifically with reference to FIGS. 4 to 7 while illustrating a specific example. FIG. 4 is a graph of a pass characteristic (S12) of a signal through hole in a substrate according to the comparative example, and FIG. 5 is a graph of pass characteristics (S12) of the signal through hole 200 in the substrate 100 according to the example. In FIG. 5, the pass characteristics when the distance C is from 0.5 mm to 2.5 mm (in 0.2 mm increments) are plotted. FIG. 6 is a Smith chart (S11) illustrating the impedance of the connection end of the signal through hole in the substrate according to the comparative example, and FIG. 7 is a Smith chart (S11) illustrating the impedance of the connection end of the signal through hole 200 in the substrate 100 according to the example. In FIG. 7, the impedance when the distance C is from 0.5 mm to 2.5 mm (in 0.1 mm increments) is plotted. Since the center of these Smith charts illustrated in FIGS. 6 and 7 is 50Ω, it means that the closer to the center, the closer to the desired impedance. Further, the example illustrated below is a merely example of the present embodiment, and the present embodiment is not limited to the following example.

Example

In the example, the substrate 100 according to the first embodiment illustrated in FIG. 1 is used. For more information, the substrate 100 (thickness 1.3 mm, relative permittivity ε=3.0, dielectric loss tangent tan δ=around 0.01) includes one signal through hole 200, and both ends thereof are electrically connected to the transmission line 400 provided on the upper face 102 and the lower face 104 of the substrate 100. Further, the above substrate 100 includes one ground through hole 300 adjacent to the signal through hole 200, both ends of the ground through hole 300 are provided so as to sandwich the substrate 100 from the vertical direction, and are electrically connected to the conductor layer 500 connected to the ground. Further, the signal through hole 200 and the ground through hole 300 shall be cylindrical with an outer diameter of 0.2 mm. Further, in the example, the distance C between the signal through hole 200 and the ground through hole 300 is set from 0.5 mm to 2.5 mm in 0.1 mm increments.

Comparative Example

As a comparative example, a substrate including a signal through hole having the same configuration as that of the example is used.

Then, the present inventors performed an electromagnetic field analysis simulation on the substrates of the example and the comparative example, and obtained the result illustrated in FIGS. 4 to 7.

As can be seen from FIG. 4, in the comparative example in which the ground through hole 300 is not provided, it was found that a loss of about 2.0 dB occurred at 10 GHz and a loss of about 4.0 dB occurred at 15 GHz. On the other hand, as can be seen from FIG. 5, in the example, (distance C is 0.5 mm to 1.7 mm), it was found that the loss was smaller than that of the comparative example in the high frequency band by providing the ground through hole 300. Specifically, in the example, an improvement by about 0.1 dB to 1.5 dB was observed at 10 GHz and an improvement by about 0.2 dB to 2.4 dB was observed at 15 GHz as compared with the comparative example.

Furthermore, as can be seen from FIG. 6, in the comparative example, the impedance is located near the center in the low frequency band, but as the frequency increases, the impedance is located so as to spread toward the outer periphery of the Smith chart. On the other hand, in the example, as can be seen from FIG. 7, the impedance is located near the center even when the frequency is high. From the above results, it was found that the impedance can be changed by providing the ground through hole 300.

Further, as can be seen from FIG. 5, in the example, the smaller the distance C, the smaller the loss tended to be. Further, as can be seen from FIG. 7, in the example, the smaller the distance C, the closer the impedance tends to be located to the center of the Smith chart. From the above results, it was found that it was possible to change the impedance of the connection end of the signal through hole 200 by adjusting the distance C from the signal through hole 200 to the ground through hole 300.

Furthermore, from these results, it was found that when the distance C was set to 1.8 mm or more, there was almost no difference between the result of the example and the result of the comparative example at around 20 GHz. That is, when the distance C is set to 1.8 mm or more, the effect of reducing the loss and improving the impedance by providing the ground through hole 300 tends to be saturated, so that it is considered that it is preferable to set the distance C to 1.7 mm or less in order to be effective. It is preferable that the distance C follows the design standard set by the manufacturer of the substrate 100.

As mentioned above, in the present embodiment, the ground through hole 300 is provided adjacent to the signal through hole 200, and the distance C between the signal through hole 200 and the ground through hole 300 is adjusted, so that the impedance of the signal through hole 200 can be controlled accurately. That is, in the present embodiment, the impedance of the connection end of the signal through hole 200 can be adjusted to be the target impedance. As a result, according to the present embodiment, since impedance mismatch between the signal through hole 200 and the transmission line 400 can be avoided, it is possible to further suppress an increase in signal propagation loss and reflection loss in the substrate 100. In addition, in the present embodiment, since the adjustment is made by the ground through hole 300, the impedance can be controlled accurately even when there is a restriction on the design freedom of the pattern on the substrate 100.

3. Second Embodiment 3.1 Configuration

In the first embodiment described above, one ground through hole 300 is provided for one signal through hole 200. However, the embodiments of the present disclosure are not limited to have one ground through hole 300 for one signal through hole 200, and may have a plurality of ground through holes 300. Hereinafter, a substrate 100a according to a second embodiment of the present disclosure in which a plurality of ground through holes 300 is provided for one signal through hole 200 will be described with reference to FIGS. 8 to 11. FIGS. 8 to 11 are perspective views illustrating an example of the substrate 100a according to the present embodiment. In FIGS. 8 to 11, in order to clearly illustrate the signal through hole 200 and the ground through holes 300 included in the substrate 100a, they are illustrated so that the substrate 100a is transparent by illustrating the outline of the substrate 100a with a broken line. Further, in FIGS. 8 to 11, for convenience, only one signal through hole 200 and its peripheral region (a region of 5 mm×5 mm square with the signal through hole 200 as the center) are illustrated. Therefore, the substrate 100a according to the present embodiment may be a form in which the form illustrated in FIGS. 8 to 11 is plurally combined.

Figure 8:
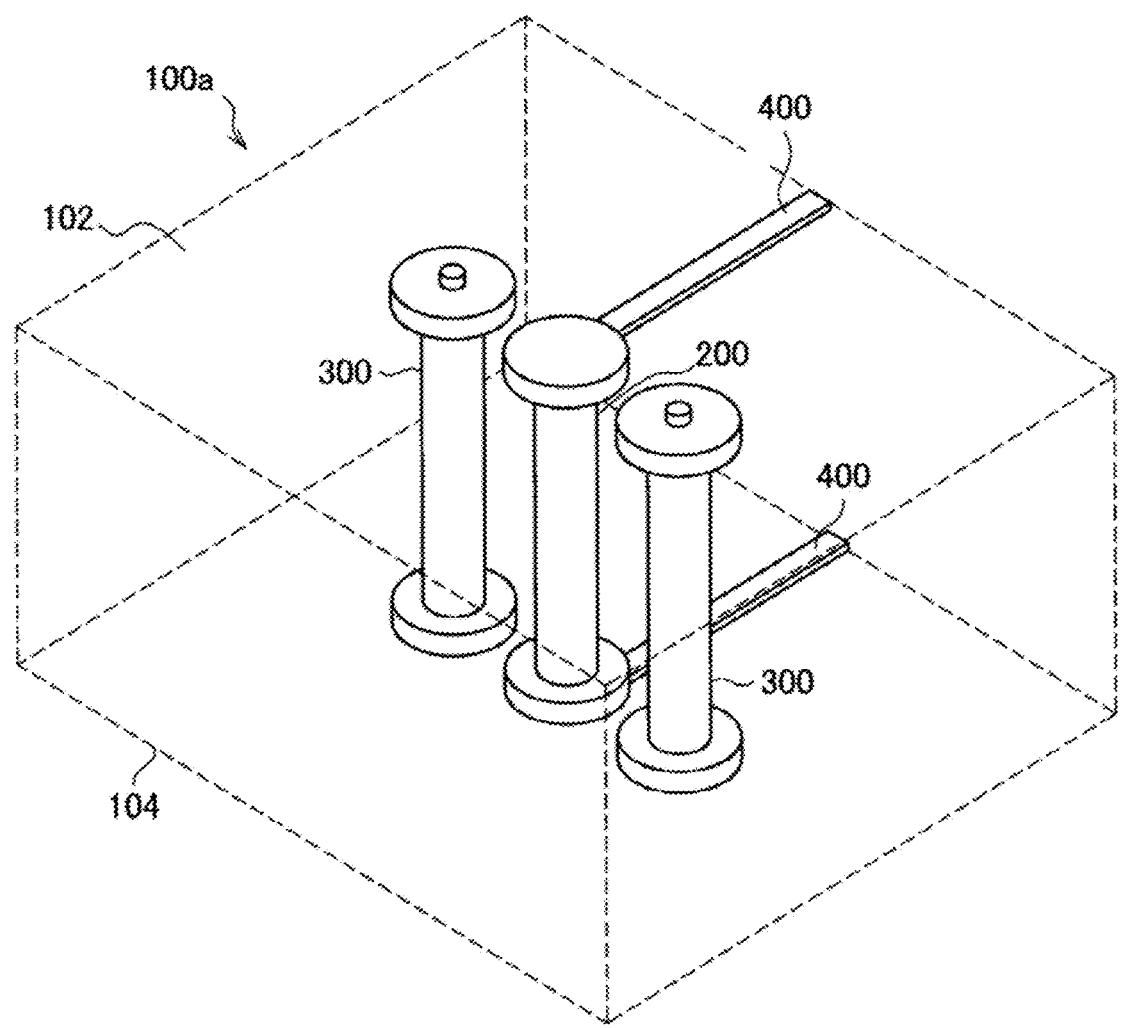
FIG. 8 is a perspective view (No. 1) illustrating an example of a substrate 100a according to a second embodiment of the present disclosure.
Figure 9:
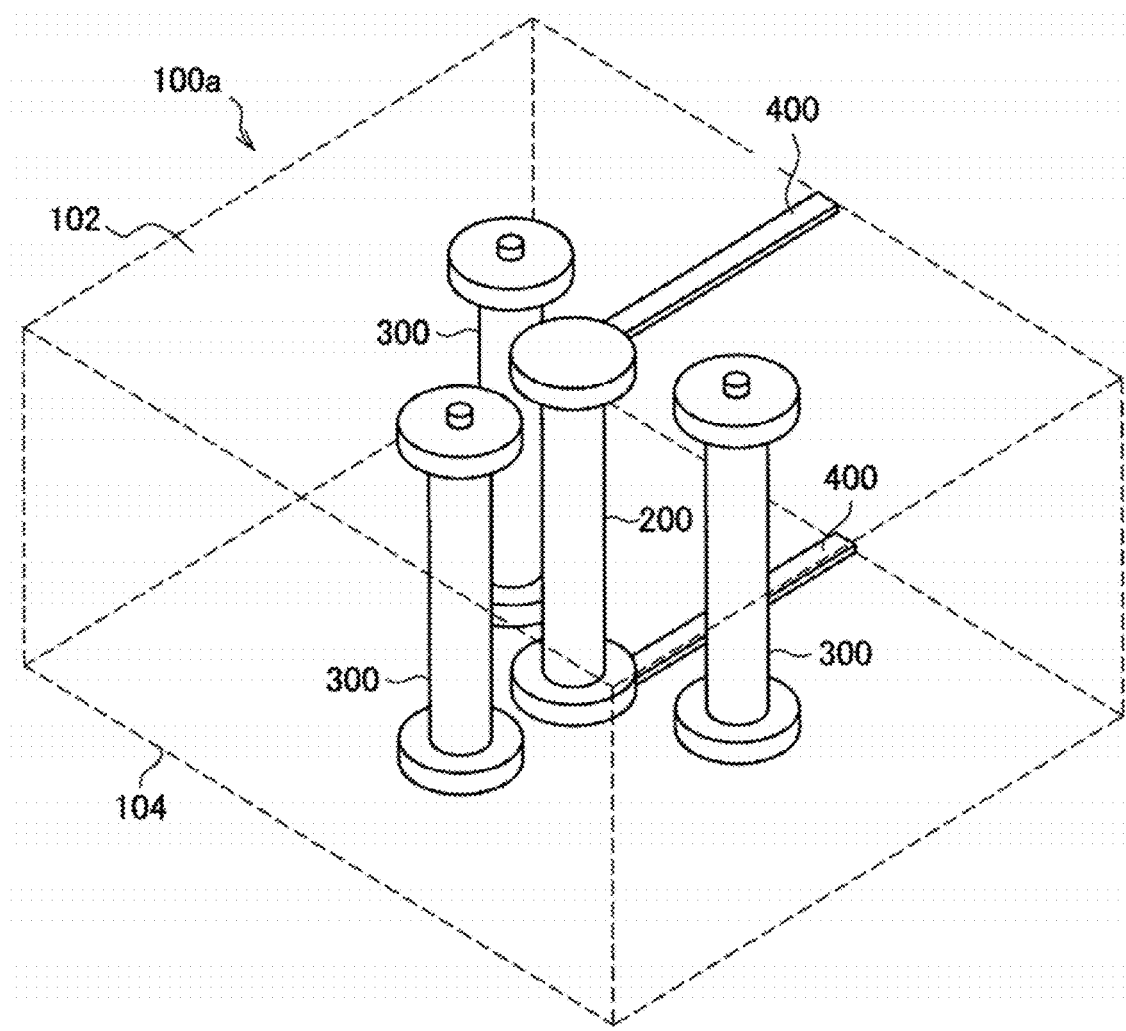
FIG. 9 is a perspective view (No. 2) illustrating an example of the substrate 100a according to the second embodiment of the present disclosure.
Figure 10:
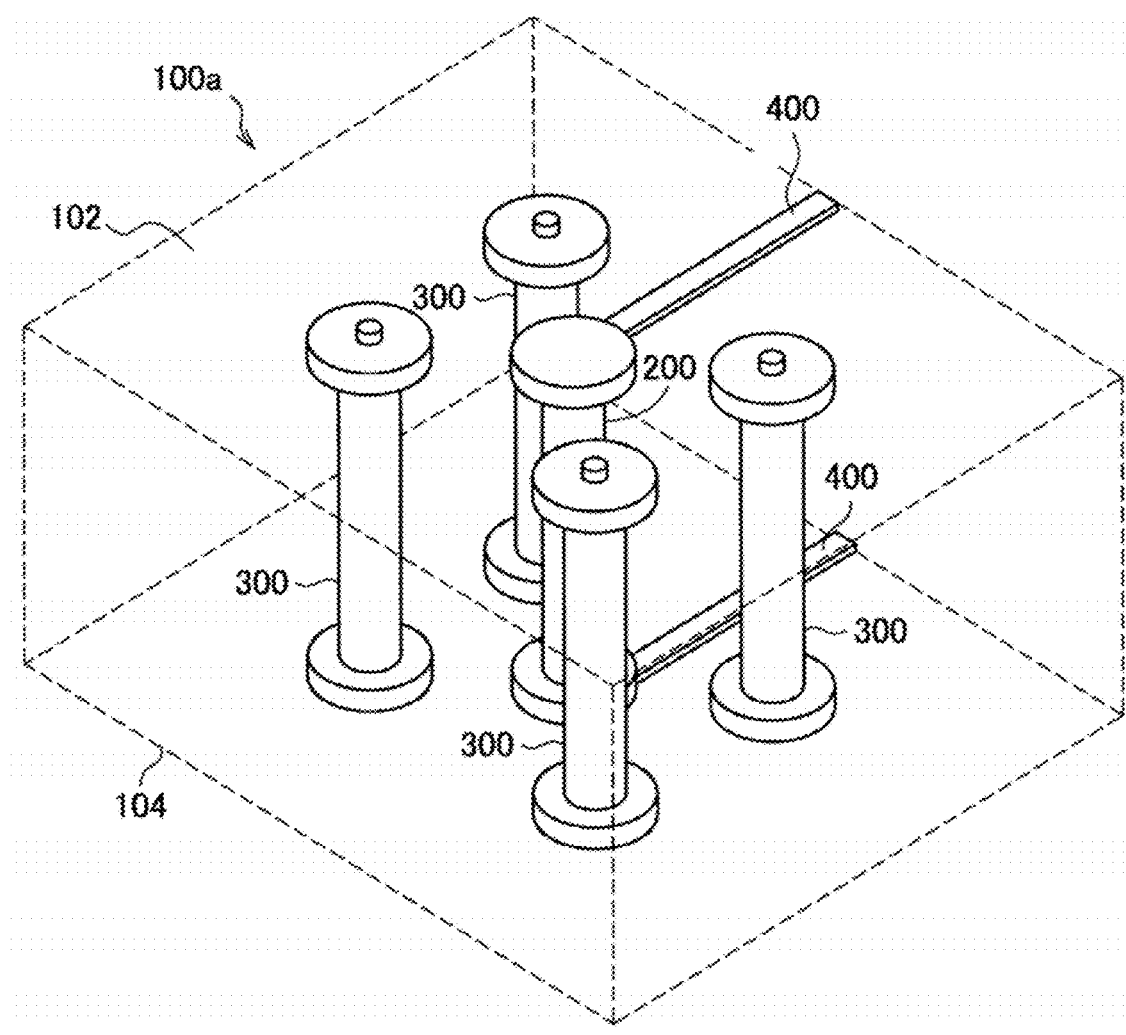
FIG. 10 is a perspective view (No. 3) illustrating an example of the substrate 100a according to the second embodiment of the present disclosure.
Figure 11:
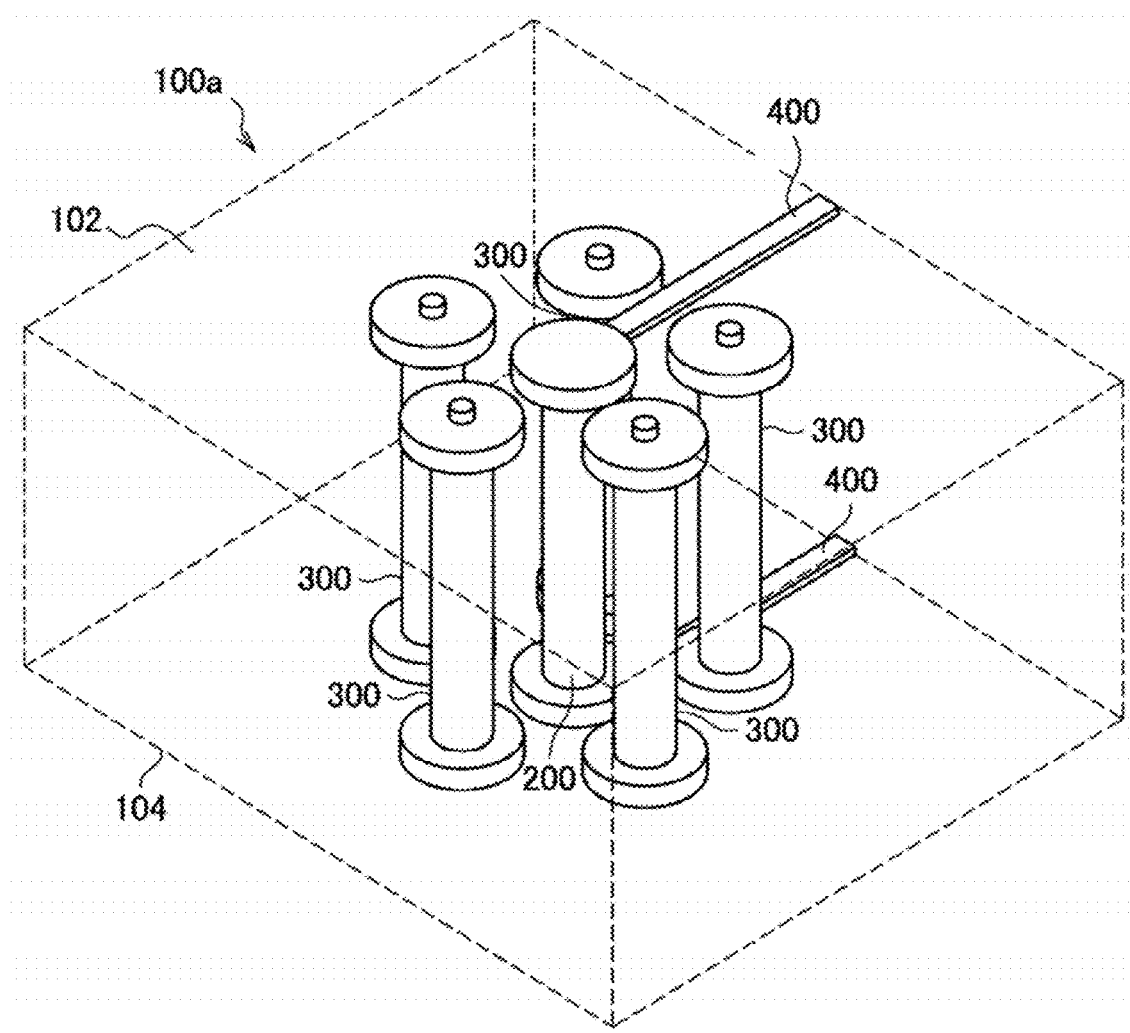
FIG. 11 is a perspective view (No. 4) illustrating an example of the substrate 100a according to the second embodiment of the present disclosure.

In the present embodiment, as illustrated in FIG. 8, two ground through holes 300 may be provided so as to be adjacent to one signal through hole 200. Moreover, in the present embodiment, as illustrated in FIG. 9, the signal through hole 200 and the ground through holes 300 may be provided so that one signal through hole 200 is surrounded by three ground through holes 300. Further, in the present embodiment, as illustrated in FIGS. 10 and 11, the signal through hole 200 and the ground through holes 300 may be provided so that one signal through hole 200 is surrounded by four or five ground through holes 300. That is, in the present embodiment, the impedance can be controlled accurately by providing the plurality of ground through holes 300 for one signal through hole 200.

In the present embodiment, six or more ground through holes 300 may be provided, and the present embodiment is not limited to the forms illustrated in FIGS. 8 to 11. Further, in FIGS. 8 to 11, all ground through holes 300 are provided so that the respective distances from the central axis of the signal through hole 200 are equal in plan view of the substrate 100a, but the present embodiment is not limited to this. In the present embodiment, for example, the ground through holes 300 may be provided so that the respective distances from the central axis of the signal through hole 200 are different.

Further, in the present embodiment, as in the first embodiment, the impedance may be controlled by adjusting the distance between each ground through hole 300 and the signal through hole 200. In addition, in the present embodiment, the impedance may be controlled by adjusting the distance between the ground through holes 300.

Further, in the present embodiment, for example, when the substrate 100a is composed of two or more different dielectric layers (not illustrated) laminated, the ground through holes 300 may be electrically connected by wiring (not illustrated) provided on an intermediate face (not illustrated) sandwiched between the dielectric layers.

In the present embodiment, it is preferable that the arrangement and distance of the ground through holes 300 follow the design standard set by the manufacturer who manufactures the substrate 100a, as in the first embodiment.

3.2 Example

Figure 12:
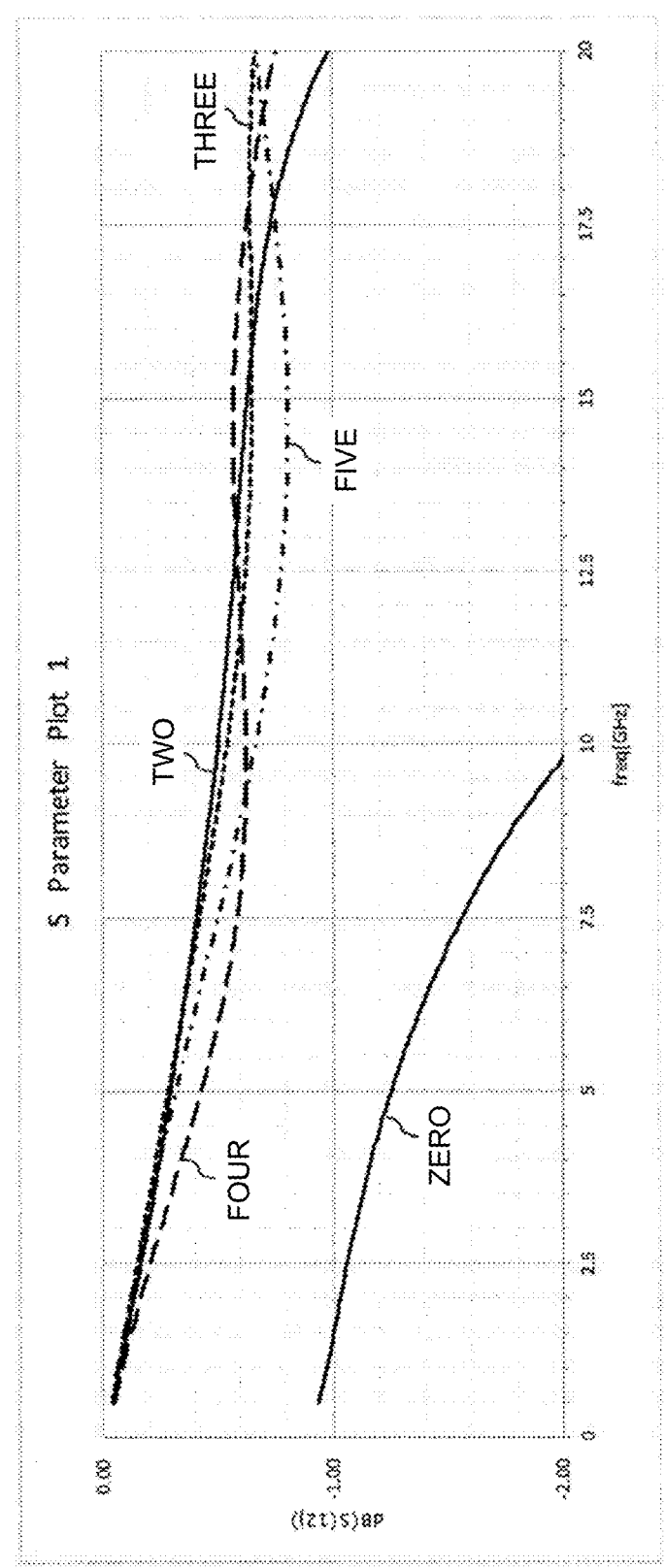
FIG. 12 is a graph of pass characteristics (S12) of a signal through hole 200 in the substrate 100a according to the example.

The details of the configuration of the substrate 100a according to the second embodiment have been described above. Next, the example of the present embodiment will be described more specifically with reference to FIG. 12 while illustrating a specific example. FIG. 12 is a graph of pass characteristics (S12) of the signal through hole 200 in the substrate 100a according to the example. In FIG. 12, the pass characteristics when the number of the ground through holes 300 is zero to five are plotted. Further, the example illustrated below is a merely example of the present embodiment, and the present embodiment is not limited to the following example.

Example

In the example, the substrate 100a according to the second embodiment illustrated in FIGS. 8 to 11 is used. For more information, the substrate 100a (thickness 1.3 mm, relative permittivity ε=3.0, dielectric loss tangent tan δ=around 0.01) includes one signal through hole 200, and both ends thereof are electrically connected to the transmission line 400 provided on the upper face 102 and the lower face 104 of the substrate 100a. Further, the substrate 100a includes two to five ground through holes 300 that are adjacent to the signal through hole 200. Both ends of the ground through hole 300 are provided so as to sandwich the substrate 100a from the vertical direction, and are electrically connected to the conductor layer 500 connected to the ground. In the example, all ground through holes 300 are provided so that the respective distances from the central axis of the signal through hole 200 are equal, and it is assumed that the distances are not changed even when the number of the ground through holes 300 changes.

Comparative Example

As a comparative example, a substrate similar to that of the comparative example of the first embodiment is used.

Then, the present inventors performed an electromagnetic field analysis simulation on the substrates of the example and the comparative example, and obtained the result illustrated in FIG. 12.

As can be seen from FIG. 12, in the example, it was found that the loss was reduced as compared with the comparative example by providing the plurality of ground through holes 300. Specifically, in the example, an improvement by about 0.5 dB was observed at 10 GHz as compared with the comparative example.

As mentioned above, in the present embodiment, the impedance of the signal through hole 200 can be controlled accurately by providing the plurality of ground through holes 300 so that they are adjacent to the signal through hole 200. As a result, since the impedance can be controlled accurately according to the present embodiment, impedance mismatch between the signal through hole 200 and the transmission line 400 can be avoided, so that it is possible to further suppress an increase in signal propagation loss and reflection loss.

4. Third Embodiment 4.1 Configuration

In the first embodiment described above, the shape of the cross section of the signal through hole 200 is cylindrical. However, in the embodiment of the present disclosure, the cross section of the signal through hole 200 is not limited to the cylindrical shape, and may have a polygonal tubular shape. Hereinafter, a substrate 100b according to a third embodiment of the present disclosure which has a signal through hole 200a having a polygonal tubular cross section will be described with reference to FIGS. 13 to 16. FIGS. 13 to 16 are perspective views illustrating an example of the substrate 100b according to the present embodiment. In addition, in FIGS. 13 to 16, in order to clearly illustrate the signal through hole 200a and the ground through holes 300 included in the substrate 100b, they are illustrated so that the substrate 100b is transparent by illustrating the outline of the substrate 100b with a broken line. Further, in these figures, in order to make the shape of the signal through hole 200a easy to understand, part of the signal through hole 200a is extracted and illustrated. Further, in FIGS. 13 to 16, for convenience, only one signal through hole 200a and its peripheral region (a region of 5 mm×5 mm square with the signal through hole 200a as the center) are illustrated. Therefore, the substrate 100b according to the present embodiment may be a form in which the form illustrated in FIGS. 13 to 16 is plurally combined.

Figure 13:
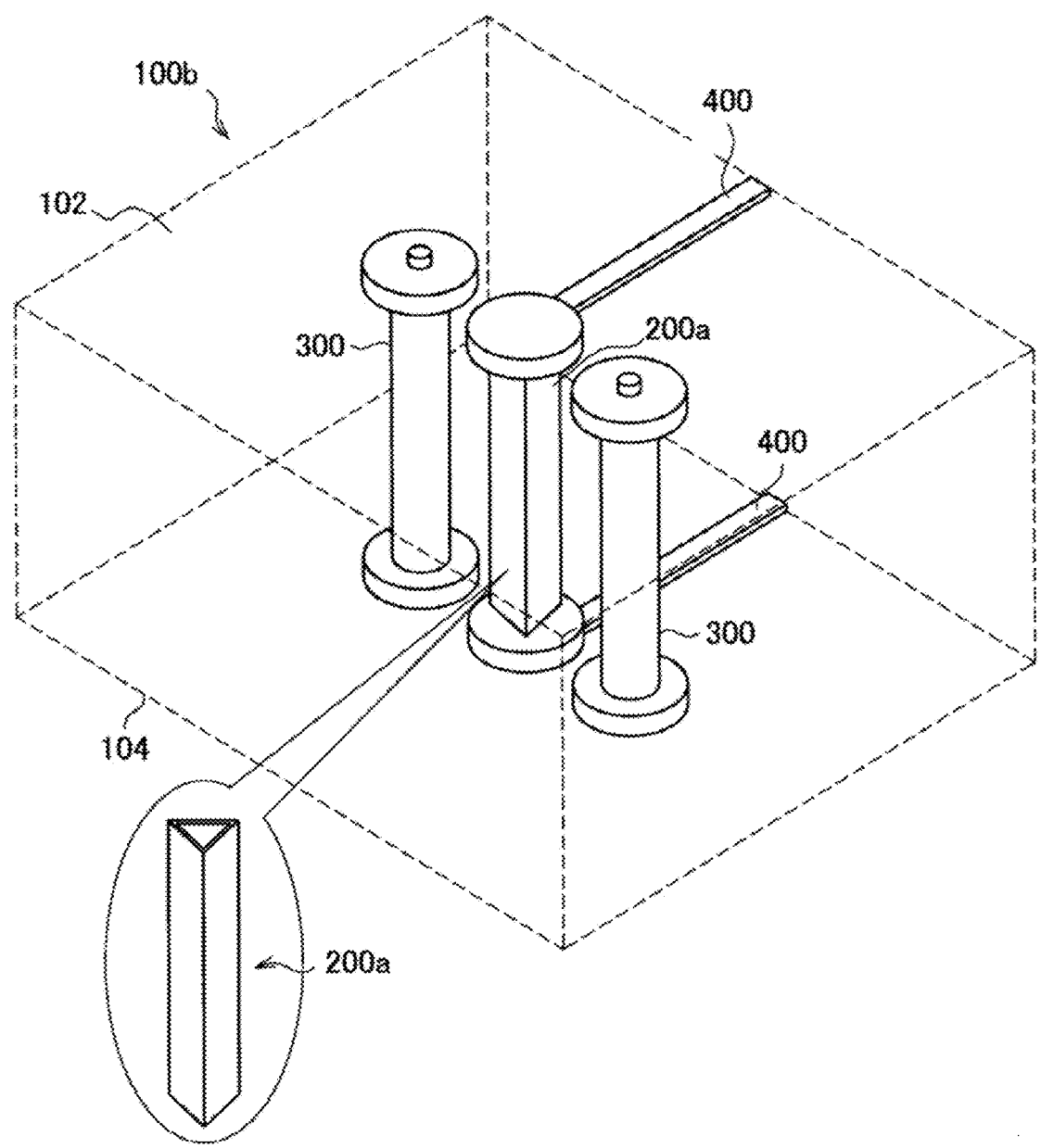
FIG. 13 is a perspective view (No. 1) illustrating an example of a substrate 100b according to a third embodiment of the present disclosure.
Figure 14:
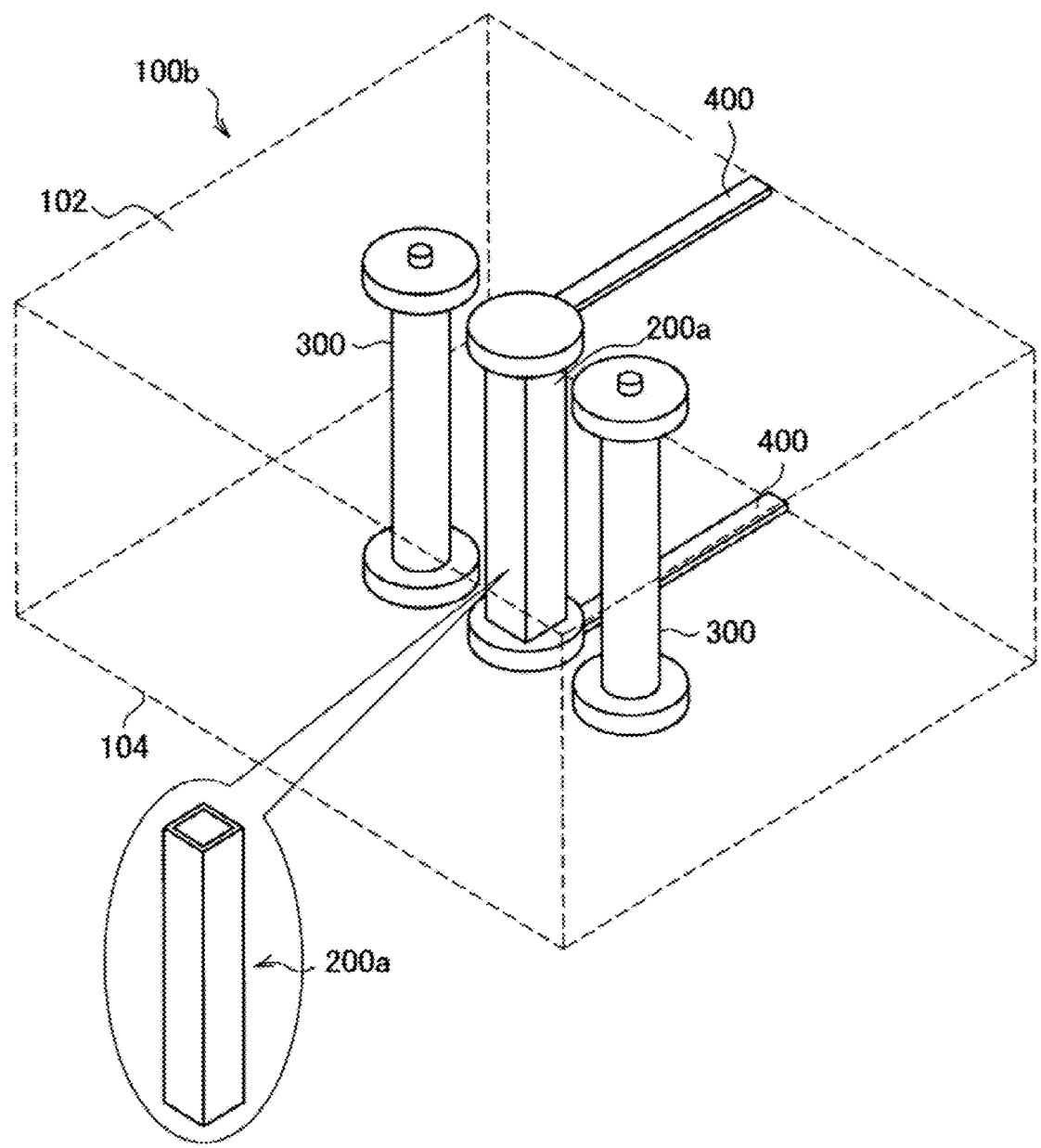
FIG. 14 is a perspective view (No. 2) illustrating an example of the substrate 100b according to the third embodiment of the present disclosure.
Figure 15:
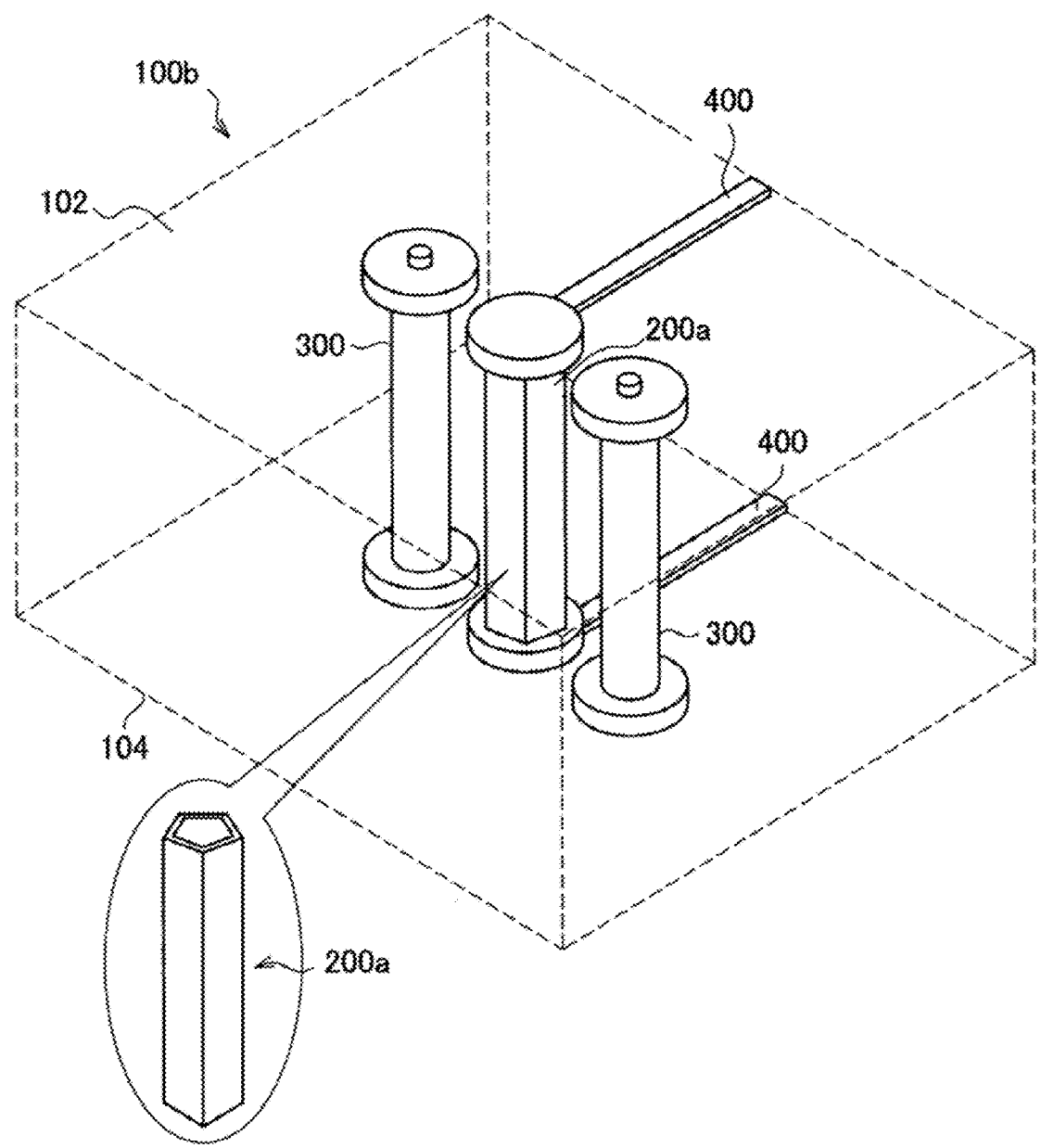
FIG. 15 is a perspective view (No. 3) illustrating an example of the substrate 100b according to the third embodiment of the present disclosure.
Figure 16:
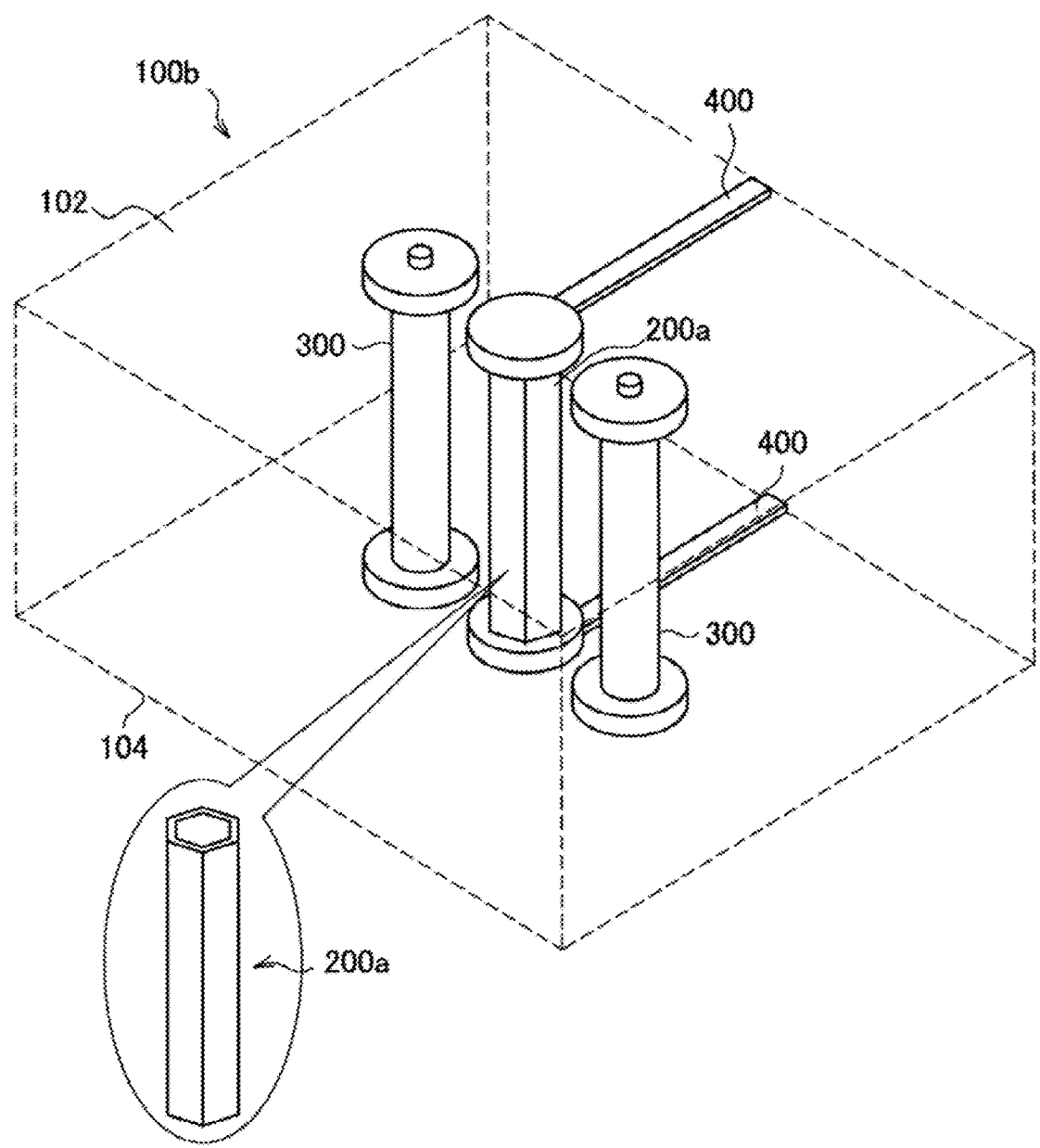
FIG. 16 is a perspective view (No. 4) illustrating an example of the substrate 100b according to the third embodiment of the present disclosure.

In the present embodiment, as illustrated in FIG. 13, the signal through hole 200a has a form in which the cross-sectional shape when cut along a plane parallel to the upper face 102 is an equilateral triangular tubular shape. Further, in the present embodiment, as illustrated in FIG. 14, the signal through hole 200a has a form in which the cross-sectional shape when cut along a plane parallel to the upper face 102 is a square tubular shape. Further, in the present embodiment, as illustrated in FIGS. 15 and 16, the signal through hole 200a has a form in which the cross-sectional shape is a regular pentagon or a regular hexagonal tubular shape. That is, in the present embodiment, the impedance can be controlled accurately by changing the cross-sectional shape of the signal through hole 200a.

In addition, in the present embodiment, the signal through hole 200a is not limited to the form illustrated in FIGS. 13 to 16, and may be a polygonal tubular shape with seven or more vertices, and may not be a regular polygonal tubular shape with vertices having the same distance from the center. Further, in the present embodiment, as in the signal through hole 200a, the cross section of the ground through hole 300 may have a polygonal tubular shape to control the impedance.

4.2 Example

Figure 17:
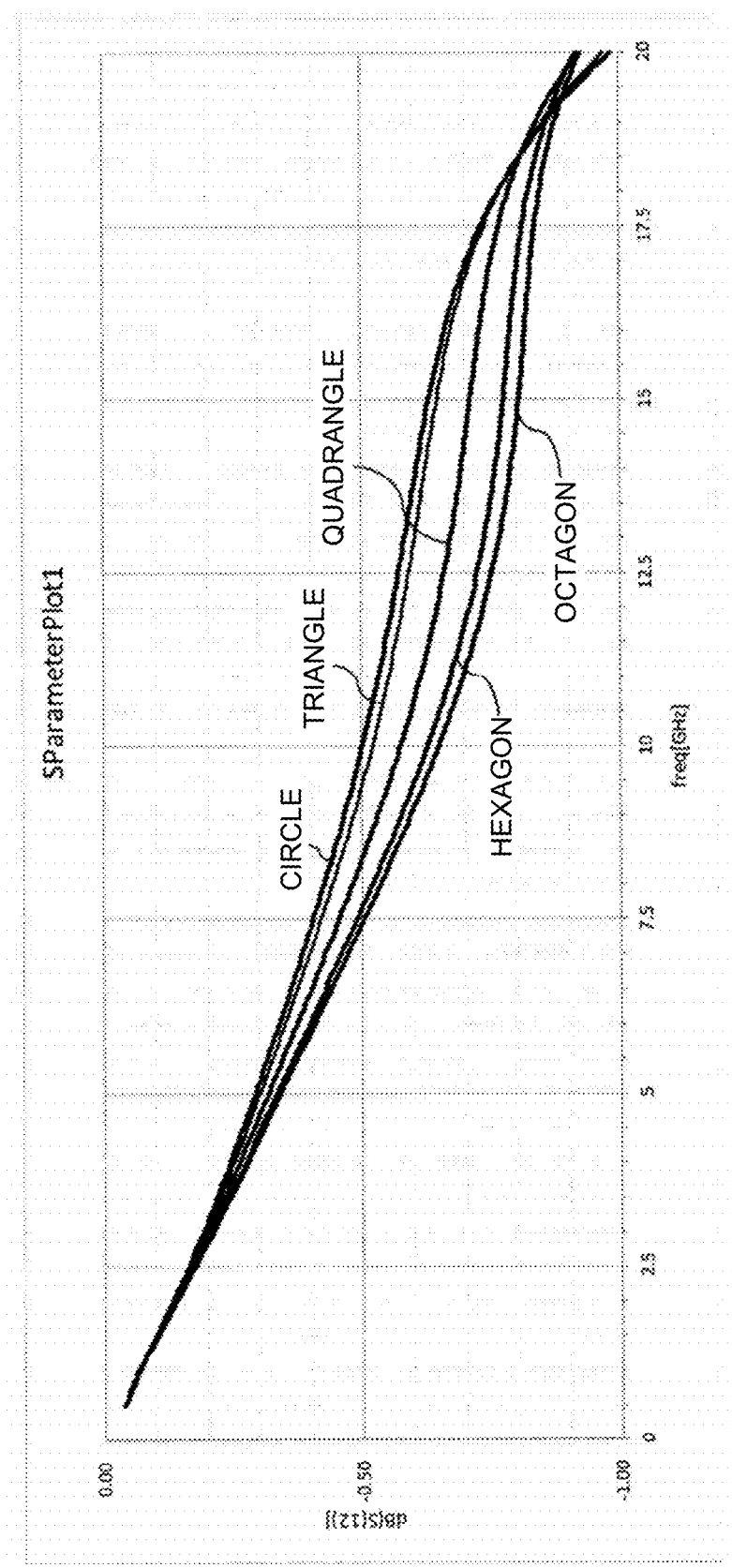
FIG. 17 is a graph of pass characteristics (S12) of a signal through hole 200a in the substrate 100b according to the example.

The details of the configuration of the substrate 100b according to the third embodiment have been described above. Next, the example of the present embodiment will be described more specifically with reference to FIG. 17 while illustrating a specific example. FIG. 17 is a graph of pass characteristics (S12) of the signal through hole 200a in the substrate 100b according to the example. In FIG. 17, the pass characteristics when the cross-sectional shape of the signal through hole 200a is a circle, an equilateral triangle, a square, a regular hexagon, or a regular octagon are plotted. Further, the example illustrated below is a merely example of the present embodiment, and the present embodiment is not limited to the following example.

In the example, the substrate 100b according to the third embodiment illustrated in FIGS. 13 to 16 is used. Further, as an example, the substrate 100b having the signal through hole 200a whose cross-section has respective tubular shapes of a regular heptagon, a regular octagon, a regular nonagon, and a regular decagon is used. For more information, the substrate 100b (thickness 1.3 mm, relative permittivity ε=3.0, dielectric loss tangent tan δ=around 0.01) includes one signal through hole 200a, and both ends thereof are electrically connected to the transmission line 400 provided on the upper face 102 and the lower face 104 of the substrate 100a. Further, in the signal through hole 200a, the cross section when cut along a plane parallel to the upper face 102 has respective tubular shapes of a circle, an equilateral triangle, a square, a regular pentagon, a regular hexagon, a regular heptagon, a regular octagon, a regular nonagon, and a regular decagon. Further, the substrate 100b includes two ground through holes 300 so that they sandwich the signal through hole 200a in plan view of the substrate 100b. Both ends of the ground through hole 300 are provided so as to sandwich the substrate 100a from the vertical direction, and are electrically connected to the conductor layer 500 connected to the ground. In the example, all the ground through holes 300 are provided so that the respective distances from the central axis of the signal through hole 200a are equal. Then, the present inventors performed an electromagnetic field analysis simulation on the substrate 100b of such an example, and obtained the result as illustrated in FIG. 17.

As can be seen from FIG. 17, in the example, it was found that the loss changed by changing the cross-sectional shape of the signal through hole 200a. Specifically, in the example, it was found that in the 10 GHz band, the polygonal tubular shape with fewer vertices had the result similar to that for the cylindrical cross-sectional shape, and the loss was reduced.

As described above, in the present embodiment, the impedance of the signal through hole 200a can be controlled accurately by changing the cross-sectional shape of the signal through hole 200a. As a result, since the impedance can be controlled accurately according to the present embodiment, impedance mismatch between the signal through hole 200a and the transmission line 400 can be avoided, so that it is possible to further suppress an increase in signal propagation loss and reflection loss.

5. Fourth Embodiment 5.1 Configuration

Figure 18:
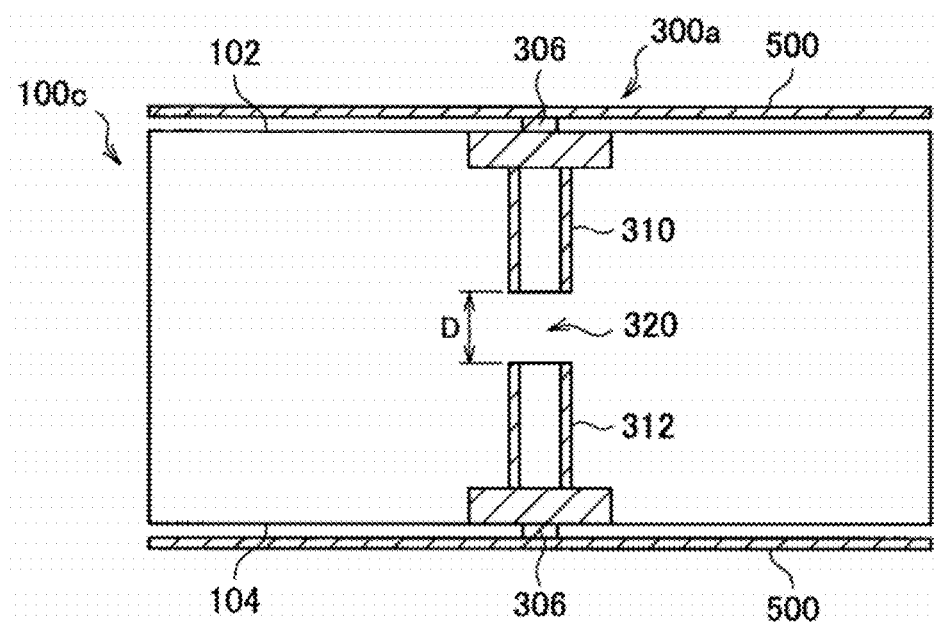
FIG. 18 is a cross-sectional view of a ground through hole 300a according to a fourth embodiment of the present disclosure.

In the first embodiment described above, the ground through hole 300 extends along a direction perpendicular to the upper face 102 of the substrate 100, and penetrates the substrate 100 from the upper face 102 to the lower face 104. However, in the embodiments of the present disclosure, the ground through hole 300 may not penetrate the substrate 100 from the upper face 102 to the lower face 104, and may be divided into two in the middle of the thickness of the substrate 100. Hereinafter, the fourth embodiment of the present disclosure having a divided ground through hole 300a will be described with reference to FIG. 18. FIG. 18 is a cross-sectional view of the ground through hole 300a according to the present embodiment, and, for more information, it is a cross-sectional view of the ground through hole 300a when cut along the thickness direction of a substrate 100c (that is, it corresponds to when it is cut along the line B-B' of FIG. 1).

For more information, as illustrated in FIG. 18, in the present embodiment, the ground through hole 300a has a first portion 310 that extends along a direction perpendicular to the upper face 102 of the substrate 100c, and penetrates the substrate 100c from the upper face 102 to the middle of the thickness of the substrate 100c. Further, the ground through hole 300a has a second portion 312 that extends along a direction perpendicular to the upper face 102 of the substrate 100c and penetrates the substrate 100 from the lower face 104 to the middle of the thickness of the substrate 100. Further, the ground through hole 300a may have a dividing portion 320 that electrically divides the first portion 310 and the second portion 312. Further, in the present embodiment, the ground contact 306 is provided at each of the end of the first portion 310 toward the upper face 102 and the end of the second portion 312 toward the lower face 104. Therefore, the first portion 310 and the second portion 312 are each electrically connected to the ground via the ground contact 306.

In the substrate 100c according to the present embodiment, the impedance of the connection end of the signal through hole 200 with the transmission line 400 can be adjusted by adjusting the length of the dividing portion 320 along the thickness direction of the substrate 100 (the length along the direction perpendicular to the upper face 102). That is, it can be said that the substrate 100c according to the present embodiment has an adjustment unit that adjusts the impedance by adjusting the length of the dividing portion 320. In the present embodiment, by having such an adjustment unit, impedance of the connection end of the signal through hole 200 can be adjusted to the desired impedance (for example, 50Ω) at a specific frequency. As a result, in the present embodiment, since impedance mismatch between the signal through hole 200 and the transmission line 400 can be avoided, it is possible to further suppress an increase in signal propagation loss and reflection loss.

For more information, in the present embodiment, the impedance of the connection end of the signal through hole 200 is adjusted by adjusting a distance D (distance from the end of the first portion 310 toward the dividing portion 320 to the end of the second portion 312 toward the dividing portion 320) illustrated in FIG. 18. A capacitance component and an inductor component are parasitically generated between the first portion 310 and the second portion 312 by providing the dividing portion 320 as described above. Then, the size and distribution of the capacitance component and the inductor component generated between the first portion 310 and the second portion 312 can be changed by adjusting the distance D. Therefore, in the present embodiment, the distance D is changed, and the above-mentioned capacitance component and inductor component are adjusted, so that the impedance of the connection end of the signal through hole 200 at a desired frequency can be set to the target impedance (for example, 50Ω). As a result, according to the present embodiment, since impedance mismatch between the signal through hole 200 and the transmission line 400 can be avoided, it is possible to further suppress an increase in signal propagation loss and reflection loss. In the present embodiment, the distance D is not particularly limited, and can be set to, for example, about 0.1 mm to 0.5 mm.

5.2 Example

Figure 19:
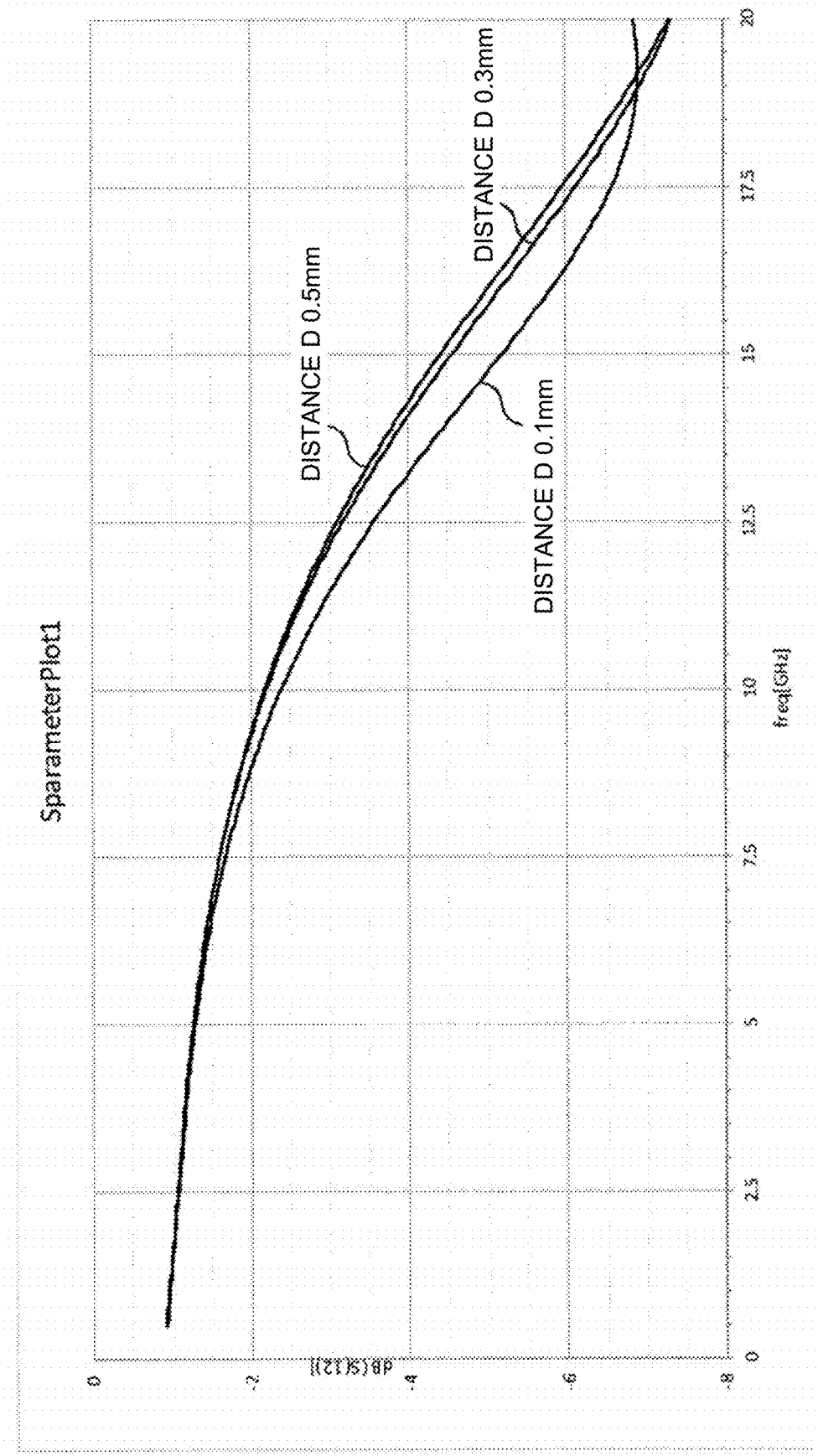
FIG. 19 is a graph of pass characteristics (S12) of a signal through hole 200 in a substrate 100c according to the example.

The details of the configuration of the substrate 100c according to the fourth embodiment have been described above. Next, the example of the present embodiment will be described more specifically with reference to FIG. 19 while illustrating a specific example. FIG. 19 is a graph of pass characteristics (S12) of the signal through hole 200 in the substrate 100c according to the example. In FIG. 19, the pass characteristics when the distance D is from 0.1 mm to 0.5 mm (in 0.2 mm increments) are plotted. Further, the example illustrated below is a merely example of the present embodiment, and the present embodiment is not limited to the following example.

In the example, the substrate 100c according to the fourth embodiment illustrated in FIG. 18 is used. For more information, the substrate 100c (thickness 1.3 mm, relative permittivity ε=3.0, dielectric loss tangent tan δ=around 0.01) includes one signal through hole 200, and both ends thereof are electrically connected to the transmission line 400 provided on the upper face 102 and the lower face 104 of the substrate 100a. Further, the substrate 100c includes two ground through holes 300a in which the respective distances from the central axis of the signal through hole 200 are equal so that they sandwich the above signal through hole 200 in plan view of the substrate 100b. Each ground through hole 300a has first and second portions 310 and 312 divided by the dividing portion 320. Further, in the example, the end of the first portion 310 toward the upper face 102 and the end of the second portion 312 toward the lower face 104 are electrically connected to the ground. Further, in the example, the length of the dividing portion 320 that divides the first and second portions 310 and 312 is set from 0.1 mm to 0.5 mm in 0.2 mm increments. Then, the present inventors performed an electromagnetic field analysis simulation on the substrate 100c of such an example, and obtained the result as illustrated in FIG. 19.

As can be seen from FIG. 19, in the example, it was found that the loss greatly changed in the frequency band higher than 10 GHz by changing the length of the dividing portion 320.

As described above, in the present embodiment, the impedance of the signal through hole 200 can be controlled accurately by changing the length of the dividing portion 320. As a result, since the impedance can be controlled accurately according to the present embodiment, impedance mismatch between the signal through hole 200 and the transmission line 400 can be avoided, so that it is possible to further suppress an increase in signal propagation loss and reflection loss.

6. Summary

As described above, according to each embodiment of the present disclosure, the impedance of the signal through hole 200 can be controlled accurately. That is, in the present embodiment, the impedance of the connection end of the signal through hole 200 can be adjusted to be the target impedance. As a result, according to the present embodiment, since impedance mismatch between the signal through hole 200 and the transmission line 400 can be avoided, it is possible to further suppress an increase in signal propagation loss and reflection loss in the substrate 100. In addition, in the present embodiment, adjustments are made according to the number, position, shape, etc. of each of the signal through holes 200 and the ground through holes 300, so that the impedance can be controlled accurately even when there are restrictions on the design freedom of the pattern on the substrate 100.

Further, the substrate 100 according to the embodiment of the present disclosure can be manufactured by using the method, device, and condition used for manufacturing a general substrate. For example, the substrate 100 according to the present embodiment can be manufactured by appropriately using a method such as metal plating. That is, the substrate 100 according to the present embodiment can be easily and inexpensively manufactured by using the existing substrate manufacturing process.

Further, the embodiments of the present disclosure described above can be implemented in combination with each other. For example, the plurality of ground through holes 300a having the dividing portions 320 may be provided by combining the second embodiment and the fourth embodiment described above.

7. Application Example

Figure 20:
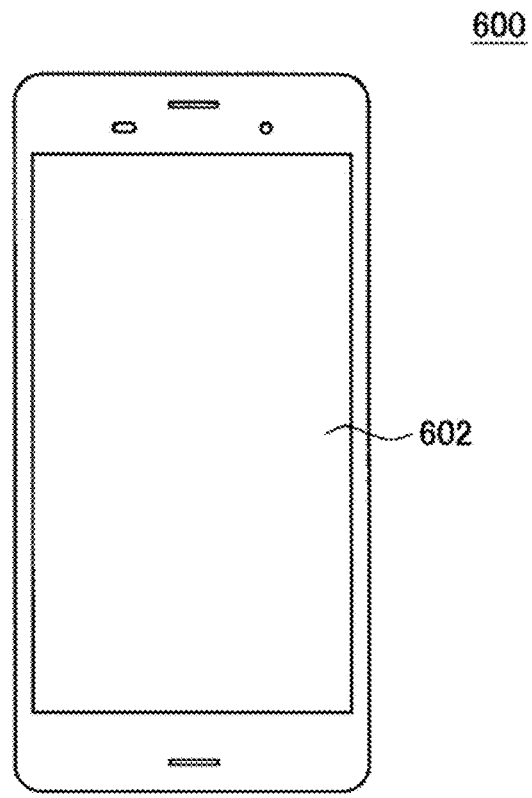
FIG. 20 is an external view (No. 1) illustrating an example of an electronic device to which the substrate 100 according to the embodiment of the present disclosure can be applied.
Figure 21:
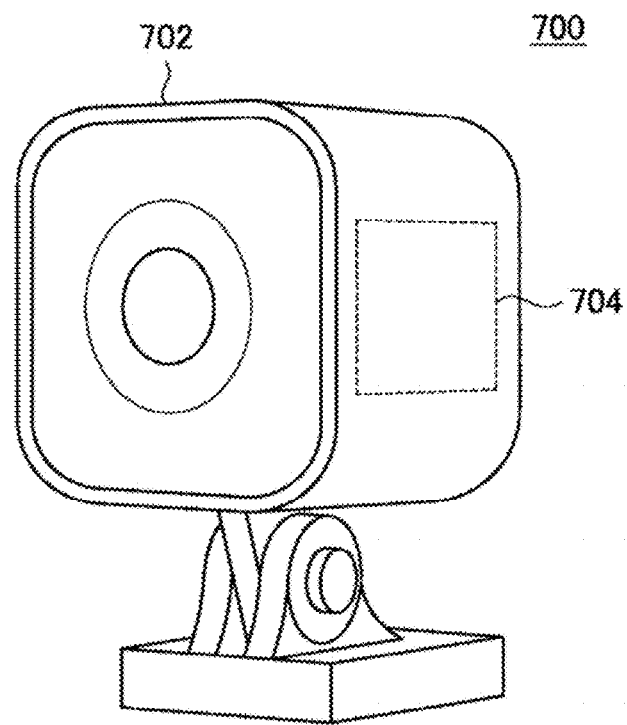
FIG. 21 is an external view (No. 2) illustrating an example of an electronic device to which the substrate 100 according to the embodiment of the present disclosure can be applied.
Figure 22:
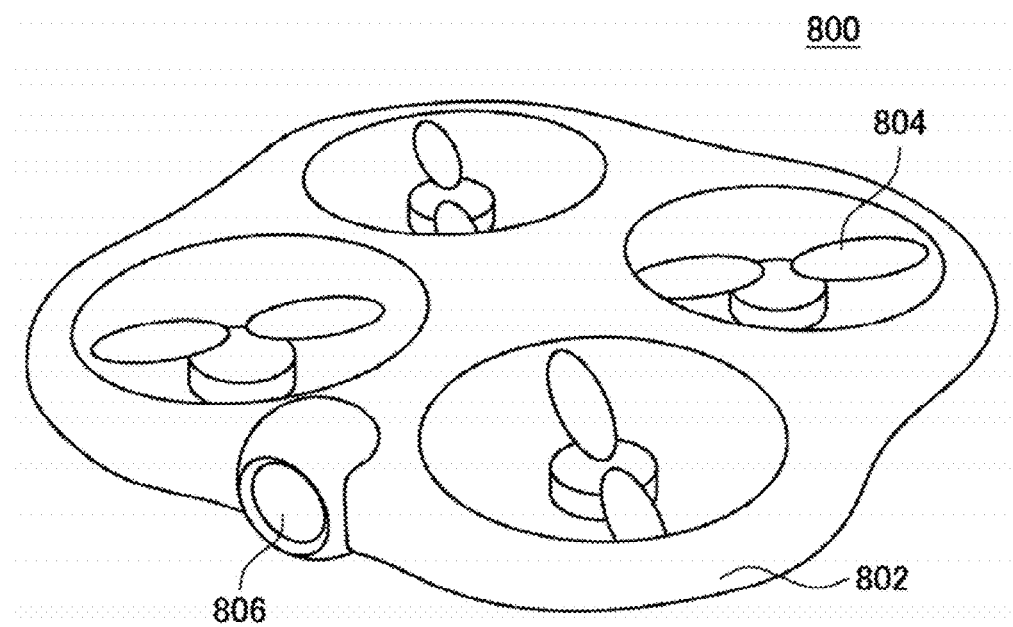
FIG. 22 is an external view (No. 3) illustrating an example of an electronic device to which the substrate 100 according to the embodiment of the present disclosure can be applied.

Subsequently, an example of an electronic device to which the substrate 100 according to the embodiment of the present disclosure can be applied will be described with reference to FIGS. 20 to 22. FIGS. 20 to 22 are external views illustrating an example of the electronic device to which the substrate 100 according to the embodiment of the present disclosure can be applied.

In recent years, a technology called an IoT (Internet of Things) that connects various things to a network is attracting attention, and radio communication can also be performed on electronic devices other than the smartphone and the tablet terminal. Therefore, for example, it is considered that the substrate 100 according to the embodiment of the present disclosure can be applied to electronic devices other than the smartphone and the like. Therefore, in the following description, as applicable electronic devices, a camera device, an unmanned aerial vehicle, and the like will in addition to the smartphone be given as examples.

(Smartphone 600)

For example, the substrate 100 according to the embodiment of the present disclosure can be applied to a substrate in a radio terminal such as a smartphone. Specifically, as illustrated in FIG. 20, a smartphone 600 has a housing unit 602 having a display unit that displays various pieces of information, a button that receives operation input by the user, and the like. Further, for example, a substrate on which a front-end circuit for radio transmission/reception and various processing circuits are mounted is provided inside the housing unit 602.

(Camera Device 700)

For example, the substrate 100 according to the embodiment of the present disclosure can be applied to a substrate in a camera device 700 called an action camera that can be mounted at various places. The camera device 700 illustrated in FIG. 21 includes, for example, a housing unit 702, and a substrate 704 on which a front-end circuit that transmits the information of the captured image and various processing circuits are mounted is provided inside the housing unit 702.

(Unmanned Aerial Vehicle 800)

Further, the substrate 100 according to the embodiment of the present disclosure can be applied to a substrate in an unmanned aerial vehicle called a drone. The drone is an unmanned small airplane, and can fly by an autonomous flight function, an autonomous attitude control function, and the like. As illustrated in FIG. 22, an unmanned aerial vehicle 800 can have a main body 802, a propeller 804, and a camera device 806. A substrate on which a front-end circuit that transmits the information of the captured image and various processing circuits are mounted is provided inside the main body 802 of the unmanned aerial vehicle 800 illustrated in FIG. 22.

The substrate 100 according to the embodiment of the present disclosure is not limited to being applied to the unmanned aerial vehicle 800 as described above, and may be mounted on various mobile devices such as automatic mobile robots and automobiles, for example.

The examples described with reference to FIGS. 20 to 22 are merely examples, and the substrate 100 according to the embodiment of the present disclosure can be applied to an electronic device (for example, a camera) as long as it includes a communication unit that communicates using high-frequency signals such as millimeter waves. Specifically, the substrate 100 according to the embodiment of the present disclosure can be used as a substrate for a front end portion provided in the housing of the electronic device, for example, in the vicinity of an antenna.

8. Supplement

The preferred embodiments of the present disclosure have been described in detail with reference to the accompanying drawings, but the technical scope of the present disclosure is not limited to such examples. It is obvious that those who are skilled in the art in the technical field of the present disclosure can find various revisions and modifications within the scope of a technical concept described in claims, and it should be understood that these revisions and modifications will also be naturally come under the technical scope of the present disclosure.

Furthermore, the effects described in the present specification are merely illustrative or exemplified effects, and are not limitative. That is, the technology according to the present disclosure can accomplish other effects apparent to those skilled in the art from the description of the present specification, in addition to or instead of the effects described above.

Note that the following configurations also belong to the technical scope of the present disclosure.

(1)

A substrate comprising:

a first through hole that penetrates the substrate from a first face to a second face of the substrate, and is electrically connected to a transmission line through which a signal is transmitted;

a second through hole that is provided adjacent to the first through hole in plan view of the substrate, penetrates the substrate from the first face to the second face, and is electrically connected to a ground; and an adjustment unit that adjusts a distance between the first through hole and the second through hole in plan view of the substrate to adjust an impedance of a connection end of the first through hole with the transmission line.

(2)

The substrate according to (1), wherein the substrate comprises a plurality of the second through holes.

(3)

The substrate according to (2), wherein the plurality of second through holes is electrically connected to each other by wiring.

(4)

The substrate according to (3), wherein the substrate has a laminated structure of two or more different dielectric layers laminated, and the wiring is provided on an intermediate face sandwiched between the dielectric layers.

(5)

A substrate comprising:

a first through hole that penetrates the substrate from a first face to a second face of the substrate, and is electrically connected to a transmission line through which a signal is transmitted;

a second through hole that is provided adjacent to the first through hole in plan view of the substrate, penetrates the substrate from the first face to the second face, and is electrically connected to a ground;

a second through hole that is provided adjacent to the first through hole in plan view of the substrate, and is electrically connected to a ground; and an adjustment unit that adjusts an impedance of a connection end of the first through hole with the transmission line, wherein the second through hole has a first portion that penetrates the substrate from the first face to a middle of a thickness of the substrate, a second portion that penetrates the substrate from the second face to a middle of a thickness of the substrate, and a dividing portion that electrically divides the first portion and the second portion, and the adjustment unit adjusts a length of the dividing portion along a thickness direction of the substrate to adjust the impedance.

(6)

The substrate according to (5), wherein the first portion and the second portion are each connected to the ground.

(7)

The substrate according to any one of (1) to (6), wherein the adjustment unit adjusts a shape of a cross section of the first through hole when cut along a plane parallel to the first face to adjust the impedance.

(8)

The substrate according to (7), wherein a cross section of the first through hole when cut along a plane parallel to the first face is cylindrical.

(9)

The substrate according to (7), wherein a cross section of the first through hole when cut along a plane parallel to the first face is polygonal tubular.

(10)

The substrate according to any one of (1) to (6), wherein the adjustment unit adjusts a shape of a cross section of the second through hole when cut along a plane parallel to the first face to adjust the impedance.

(11)

The substrate according to (10), wherein a cross section of the second through hole when cut along a plane parallel to the first face is cylindrical.

(12)

The substrate according to (10), wherein a cross section of the second through hole when cut along a plane parallel to the first face is polygonal tubular.

(13)

The substrate according to any one of (1) to (12), wherein each of the first through hole and the second through hole has
   a through hole penetrating the substrate and
   a metal film covering an inner wall of the through hole.

(14)

The substrate according to any one of (1) to (13), wherein the transmission line is electrically connected to the transmission line through a transmission line contact provided on at least one face of the first face and the second face.

(15)

The substrate according to any one of (1) to (14), wherein the second through hole is electrically connected to the ground through a ground contact provided on at least one face of the first face and the second face.

(16)

An electronic device comprising a substrate, wherein
the substrate includes
a first through hole that penetrates a substrate from a first face to a second face of the substrate, and is electrically connected to a transmission line through which a signal is transmitted,
a second through hole that is provided adjacent to the first through hole in plan view of the substrate, penetrates the substrate from the first face to the second face, and is electrically connected to a ground, and
an adjustment unit that adjusts a distance between the first through hole and the second through hole in plan view of the substrate to adjust an impedance of a connection end of the first through hole with the transmission line.

REFERENCE SIGNS LIST 100, 100a, 100b, 100c, 704 SUBSTRATE
102 UPPER FACE
104 LOWER FACE
200, 200a SIGNAL THROUGH HOLE
202, 302 THROUGH HOLE
204, 304 METAL FILM
206 SIGNAL CONTACT
300, 300a GROUND THROUGH HOLE
306 GROUND CONTACT
310 FIRST PORTION
312 SECOND PORTION
320 DIVIDING PORTION
400 TRANSMISSION LINE
500 CONDUCTOR LAYER
600 SMARTPHONE
602, 702 HOUSING UNIT
700, 806 CAMERA DEVICE
800 UNMANNED AERIAL VEHICLE
802 MAIN BODY
804 PROPELLER

The invention claimed is:

1. A substrate comprising:
a first through hole that penetrates the substrate from a first face to a second face of the substrate, and is electrically connected to a transmission line through which a signal is transmitted;
a second through hole that is provided adjacent to the first through hole in a plan view of the substrate, penetrates the substrate from the first face to the second face, and is electrically connected to a ground; and
an adjustment unit that adjusts a distance between the first through hole and the second through hole in the plan view of the substrate to adjust an impedance of a connection end of the first through hole with the transmission line,
wherein a shape of a cross section of the first through hole differs from a shape of a cross section of the second through hole.

2. The substrate according to claim 1, wherein the substrate comprises a plurality of the second through holes.

3. The substrate according to claim 2, wherein the plurality of second through holes is electrically connected to each other by wiring.

4. The substrate according to claim 3, wherein
the substrate has a laminated structure of two or more different dielectric layers laminated, and
the wiring is provided on an intermediate face sandwiched between the dielectric layers.

5. The substrate according to claim 2, wherein the plurality of second through holes include at least five second through holes surrounding the first through hole.

6. The substrate according to claim 1, wherein the adjustment unit adjusts the shape of the cross section of the first through hole when cut along a plane parallel to the first face to adjust the impedance.

7. The substrate according to claim 6, wherein the cross section of the first through hole when cut along a plane parallel to the first face is cylindrical.

8. The substrate according to claim 6, wherein the cross section of the first through hole when cut along a plane parallel to the first face is polygonal tubular.

9. The substrate according to claim 8, wherein the polygonal tubular shape includes a triangular tube or a quadrangular tube.

10. The substrate according to claim 1, wherein the adjustment unit adjusts the shape of the cross section of the second through hole when cut along a plane parallel to the first face to adjust the impedance.

11. The substrate according to claim 10, wherein the cross section of the second through hole when cut along a plane parallel to the first face is cylindrical.

12. The substrate according to claim 10, wherein the cross section of the second through hole when cut along a plane parallel to the first face is polygonal tubular.

13. The substrate according to claim 1, wherein
each of the first through hole and the second through hole includes
a through hole penetrating the substrate and
a metal film covering an inner wall of the through hole.

14. The substrate according to claim 13, wherein the metal film includes copper.

15. The substrate according to claim 1, wherein the first through hole is electrically connected to the transmission line through a transmission line contact provided on at least one face of the first face and the second face.

16. The substrate according to claim 1, wherein the second through hole is electrically connected to the ground through a ground contact provided on at least one face of the first face and the second face.

17. The substrate according to claim 1, wherein the substrate has a relative permittivity between 3.0 and 5.0.

18. An electronic device comprising a substrate, wherein the substrate includes
- a first through hole that penetrates a substrate from a first face to a second face of the substrate, and is electrically connected to a transmission line through which a signal is transmitted,
- a second through hole that is provided adjacent to the first through hole in a plan view of the substrate, penetrates the substrate from the first face to the second face, and is electrically connected to a ground, and
- an adjustment unit that adjusts a distance between the first through hole and the second through hole in the plan view of the substrate to adjust an impedance of a connection end of the first through hole with the transmission line, wherein a shape of a cross section of the first through hole differs from a shape of a cross section of the second through hole.

19. A substrate comprising:
- a first through hole that penetrates the substrate from a first face to a second face of the substrate, and is electrically connected to a transmission line through which a signal is transmitted;
- a second through hole that is provided adjacent to the first through hole in a plan view of the substrate, and is electrically connected to a ground; and
- an adjustment unit that adjusts an impedance of a connection end of the first through hole with the transmission line, wherein the second through hole includes
- a first portion that penetrates the substrate from the first face to a middle of a thickness of the substrate,
- a second portion that penetrates the substrate from the second face to a middle of
- a thickness of the substrate, and
- a dividing portion that electrically divides the first portion and the second portion, and the adjustment unit adjusts a length of the dividing portion along a thickness direction of the substrate to adjust the impedance.

20. The substrate according to claim 19, wherein the first portion and the second portion are each connected to the ground.

* * * * *